(12) United States Patent
Huff et al.

(10) Patent No.: US 9,536,706 B2
(45) Date of Patent: Jan. 3, 2017

(54) SELF-ALIGNED DYNAMIC PATTERN GENERATOR DEVICE AND METHOD OF FABRICATION

(71) Applicant: CORPORATION FOR NATIONAL RESEARCH INITIATIVES, Reston, VA (US)

(72) Inventors: Michael A. Huff, Oakton, VA (US); Michael Pedersen, Ashton, MD (US)

(73) Assignee: CORPORATION FOR NATIONAL RESEARCH INITIATIVES, Reston, VA (US)

(*) Notice: Subject to any disclaimer, the term of this patent is extended or adjusted under 35 U.S.C. 154(b) by 0 days.

(21) Appl. No.: 15/048,004

(22) Filed: Feb. 19, 2016

(65) Prior Publication Data
US 2016/0233054 A1 Aug. 11, 2016

Related U.S. Application Data

(62) Division of application No. 13/838,453, filed on Mar. 15, 2013, now Pat. No. 9,312,103.

(51) Int. Cl.
*A61N 5/00* (2006.01)
*G03B 27/32* (2006.01)
(Continued)

(52) U.S. Cl.
CPC ......... *H01J 37/3175* (2013.01); *G03F 7/2059* (2013.01); *G03F 7/70383* (2013.01); *H01J 37/3177* (2013.01); *H01L 21/0277* (2013.01); *H01L 21/67005* (2013.01); *H01J 2237/31723* (2013.01); *H01J 2237/31754* (2013.01); *H01J 2237/31774* (2013.01); *H01J 2237/31789* (2013.01)

(58) Field of Classification Search
CPC .. G03F 7/2051; G03F 7/2059; G03F 7/70216; G03F 7/70383; G03F 7/70391; H01J 37/3174; H01J 37/3175; H01J 37/3177; H01J 2237/31723; H01J 2237/3175; H01J 2237/31754; H01J 2237/31761; H01J 2237/31774; H01J 2237/31789; H01L 21/0277; H01L 21/67005
USPC ........... 216/18; 250/492.2–492.3; 355/67, 77
See application file for complete search history.

(56) References Cited

U.S. PATENT DOCUMENTS

| 8,253,119 | B1* | 8/2012 | Brodie | H01J 37/3175 250/306 |
| 8,933,425 | B1* | 1/2015 | Bevis | H01J 37/153 250/396 R |
| 2008/0169436 | A1* | 7/2008 | Carroll | B82Y 10/00 250/492.22 |

* cited by examiner

*Primary Examiner* — Colin Kreutzer
(74) *Attorney, Agent, or Firm* — Nixon & Vanderhye PC

(57) ABSTRACT

A dynamic pattern generator (DPG) device and method of making a DPG device are disclosed. The DPG device is used in semiconductor processing tools that require multiple electron-beams, such as direct-write lithography. The device is a self-aligned DPG device that enormously reduces the required tolerances for aligning the various electrode layers, as compared to other design configurations including the non-self-aligned approach and also greatly simplifies the process complexity and cost. A process sequence for both integrated and non-integrated versions of the self-aligned DPG device is described. Additionally, an advanced self-aligned DPG device that eliminates the need for a charge dissipating coating or layer to be used on the device is described. Finally, a fabrication process for the implementation of both integrated and non-integrated versions of the advanced self-aligned DPG device is described.

19 Claims, 24 Drawing Sheets

(51) Int. Cl.
*G03B 27/54* (2006.01)
*H01J 37/317* (2006.01)
*G03F 7/20* (2006.01)
*H01L 21/027* (2006.01)
*H01L 21/67* (2006.01)

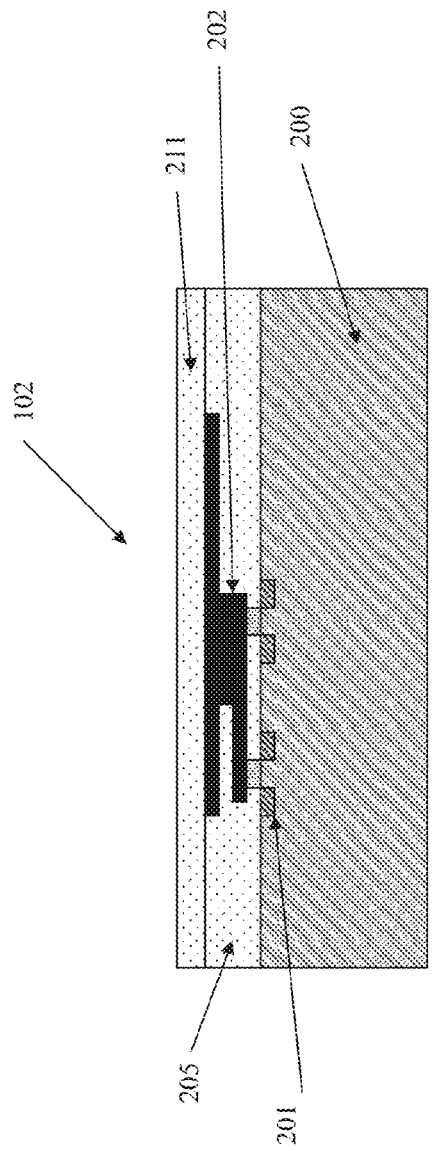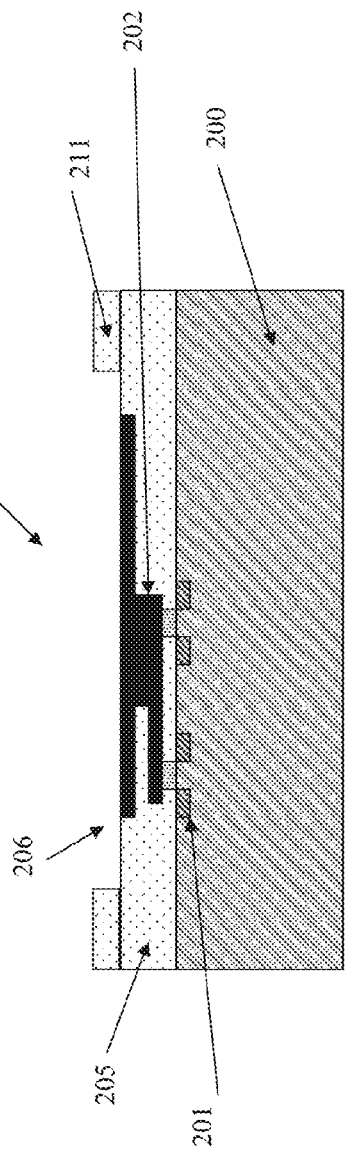

SELF-ALIGNED DYNAMIC PATTERN GENERATOR DEVICE AND METHOD OF FABRICATION

This application is a divisional of U.S. application Ser. No. 13/838,453, filed Mar. 15, 2013, the entire contents of which are incorporated herein by reference.

FIELD OF THE INVENTION

The present invention is directed to a device design and method of fabrication of a dynamic pattern generator device for use in applications requiring multiple electron-beams such as electron-beam imaging and direct-write lithography. The dynamic pattern generator devices of the present invention have application in any product or system employing electron beams or sources, including: electron-beam imaging; electron-beam lithography; field electron spectroscopy; electron-gun sources; electron-beam sensing; etc. These devices can be implemented as a single device or as arrays of devices, even very large arrays of devices. The present invention allows large device arrays to be implemented allowing a multiplicity of individually controlled electron beams to be created that can be used for high-performance, high-resolution, high-through-put, electron-beam imaging and electron-beam lithography at a comparatively low cost.

BACKGROUND OF THE INVENTION

Various groups are working to develop an electron-beam direct-write lithography tool technology that uses multiple electron beams rather than the present state-of-the-art, which uses only a single electron beam. This would allow very high resolution lithography made possible with direct-write e-beam lithography, but at higher speeds than are possible with a single electron beam in the present direct-write e-beam systems.

Electron beam lithography has some distinct advantages for resolving extremely small feature sizes since the wavelength of an electron beam is small compared to that of optical frequencies. Currently, single electron beam lithography is capable of resolving feature sizes down to approximately 10 nanometers and therefore exceeds the resolution of any currently used photolithography platform in the semiconductor manufacturing industry.

However, current electron-beam lithography systems can write using only a single electron-beam and the time required to write large and complicated patterns on the substrate surfaces is exceedingly long compared to conventional photolithography thereby making e-beam lithography too costly for most production applications.

However, if a multiplicity of electron-beams is used simultaneously to direct write patterns, then the scan rates and substrate through-puts are increased accordingly and e-beam lithography becomes much more attractive for production applications.

Multiple electron-beam (e-beam) direct-write lithography tools are capable of performing lithography at the 45 nanometer node with the potential of scaling the resolved features sizes down to the 32 nanometer node and beyond (i.e., 22 nanometer node, 16 nanometer node, 11 nanometer node), possibly capable of resolving features to below that of the level of current e-beam lithographic systems of around 10 nanometers.

A key benefit of this tool is the capability to allow the production of small lots of wafers while using state-of-the-art fabrication technologies, at low-cost and with quick turn-around times. Part of the cost reduction is that direct-write e-beam lithography does not require a set of photolithographic masks, which become increasingly expensive as the feature sizes get smaller. Some important applications often require small numbers of wafers and devices, whether they be microelectronic, MEMS, NEMS, photonic, etc., or some combination therein, and it is frequently cost prohibitive to produce these devices using the most advanced photolithographic technologies in extremely small batch sizes because the amortization costs of the photolithographic mask set can only be spread over a relatively small number of wafers. Moreover, a multiple e-beam direct-write lithography tool can be installed in a foundry to enable affordable production of small lots of state-of-the-art nanosystems for a broad spectrum of existing and emerging applications. Additionally, it is expected that a multiple e-beam direct-write lithography tool technology will also find wide application in the commercial sector for nanopatterning masks for DUV lithography and templates for imprint lithography, thus defraying enormous tool infrastructure costs.

BRIEF DESCRIPTION OF THE INVENTION

The present invention is directed to a device design and method for the fabrication of a dynamic pattern generator (DPG) device for use in applications requiring multiple electron-beams such as direct-write lithography. The DPG devices of the present invention have application in any product or system employing electron beams or sources, including: electron-beam imaging; electron-beam lithography; field electron spectroscopy; electron-gun sources; electron-beam sensing; etc. The DPG devices of the present invention can be implemented as a single device or as arrays of devices, even very large arrays of devices. The present invention allows large device arrays to be implemented allowing a multiplicity of individually controlled electron beams to be created that can be used for faster-through-put, high performance, high-resolution electron-beam imaging and electron-beam lithography.

A critical component of one configuration of the multiple e-beam direct-write lithography tool is the dynamic pattern generator (DPG) device. The DPG device is an array of micron-scale pixels or columns, wherein each pixel is individually addressed. Nominally, the array size is approximately 256 pixels by 4000 pixels, but the DPG device array can be made in a variety of sizes depending on the application, writing speeds, and writing frame size (area) desired. The purpose of the DPG is to modulate the electron beams generated from a thermionic cathode by biasing particular pixels of the array at either a low negative voltage or at ground potential. When pixels are biased at a low potential, the local electron beam is reflected; when pixels are biased at ground potential, the local electron beam is absorbed at very near zero energy. The patterned, reflected electron beam is then reaccelerated and rotated by the magnetic prism, de-magnified by a magnetic optical system, and used to directly pattern the resist on the surface of the wafer. The DPG device can be integrated on a CMOS substrate to enable individual pixel addressing, but DPG arrays can also be made on other substrates, such as silicon, and individual pixels can be addressed using off-chip electronics.

A key element of the present invention is a self-aligned device design and fabrication process for the DPG device wherein the alignment precision of the individual electrode layers in the device is nearly perfect and the fabrication of the DPG device is less complex and expensive.

Another key element in the present invention is the use of a high resistivity intermediate layer or layers between the electrode layers in the DPG device that dissipates electronic charges that develop in the DPG columns or pixels of the device array thereby eliminating the requirement of any charge dissipating layer or coating to be deposited in the pixels or columns of the DPG devices.

DETAILED DESCRIPTION OF THE INVENTION

The present invention is directed to a device design and method of fabrication of a dynamic pattern generator device for use in applications requiring multiple electron-beams such as electron-beam imaging and direct-write lithography. The dynamic pattern generator devices of the present invention have application in any product or system employing electron beams or sources, including: electron-beam imaging; electron-beam lithography; field electron spectroscopy; electron-gun sources; electron-beam sensing; etc. These devices can be implemented as a single device or as arrays of devices, even very large arrays of devices. The present invention allows large device arrays to be implemented allowing a multiplicity of individually controlled electron beams to be created that can be used for high-performance, high-resolution, high-through-put, electron-beam imaging and electron-beam lithography at a comparatively low cost.

Figure 1:
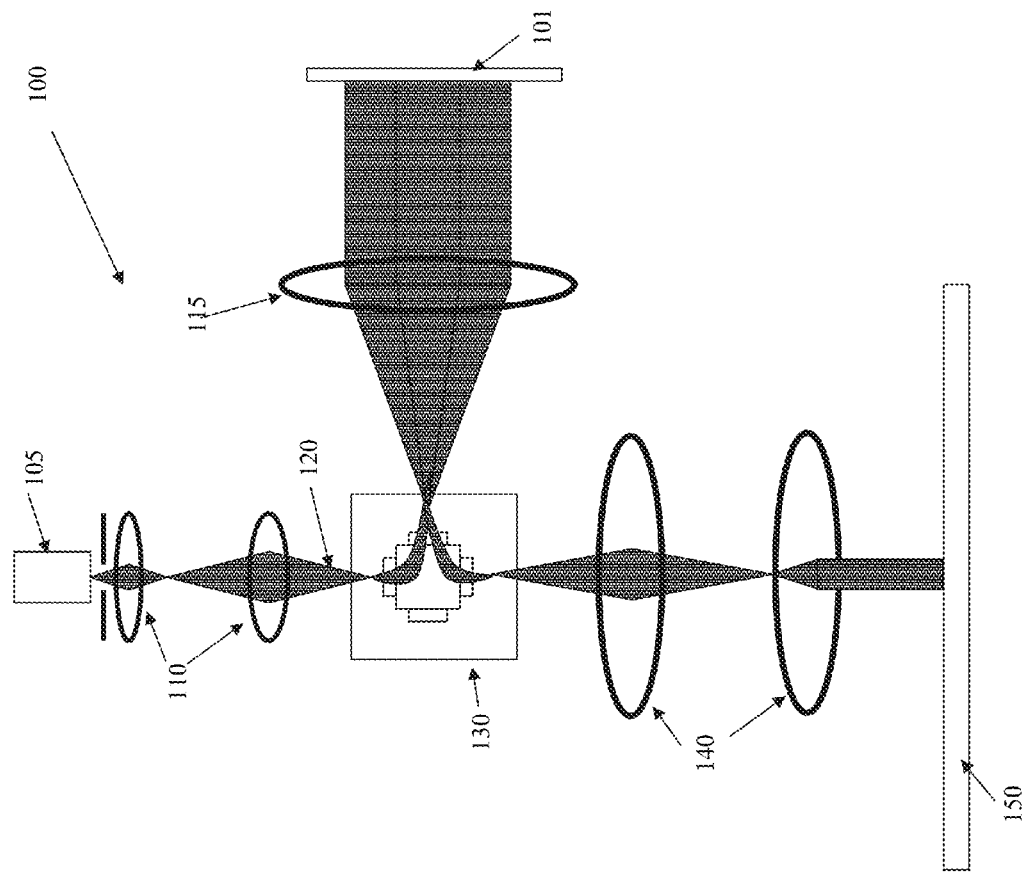
FIG. 1 is prior-art system level diagram of an e-beam lithography system containing the DPG device.

A representative system 100 containing a DPG device is illustrated in FIG. 1 and is an illustration of one configuration for a maskless reflection electron beam projection lithographic system. Importantly, other configurations are possible that can also use the DPG device of the present invention. An electron gun or cathode 105 generates a plurality of electron beams 120. Upon emission from the cathode 105, the electron beam 120 is focused using a series of illumination optics 110. The electron beam impinges onto a magnetic prism and separator 130 that is used to steer the desired parts of the electron beam 120 towards the objective optics 115. The electron beam 120 passes through the objective optics 115 and is focused onto the dynamic pattern generator device 101. The dynamic pattern generator device 101 is an array of pixel elements that modulates the electron beam 120 by impressing onto the electron beam 120 a two-dimensional pattern desired to be written onto the substrate 150, by either reflecting or absorbing the individual electron beams 120 impinging on each pixel of the DPG array 101.

The reflected elements of the electron beam 120 pass back through the objective optics 115 and impinge onto the magnetic prism and separator 130, which is used to steer the desired elements of the electron beam 120 toward the projection optics 140. The electron beam 120 is focused using the projection optics 140 onto a wafer or substrate 150 that rests on a stage (not shown). The wafer has a photoresist on its surface that is sensitive to electron beams and thereby the electron beam pattern is imaged onto this photoresist layer so as to impress the desired 2-dimensional pattern onto the wafer. The wafer or substrate 150 rests on a mechanical stage (not shown) that can precisely move in the x- and y-directions so as to allow the writing of a pattern over the entire wafer or substrate 150 surface.

Figure 2:
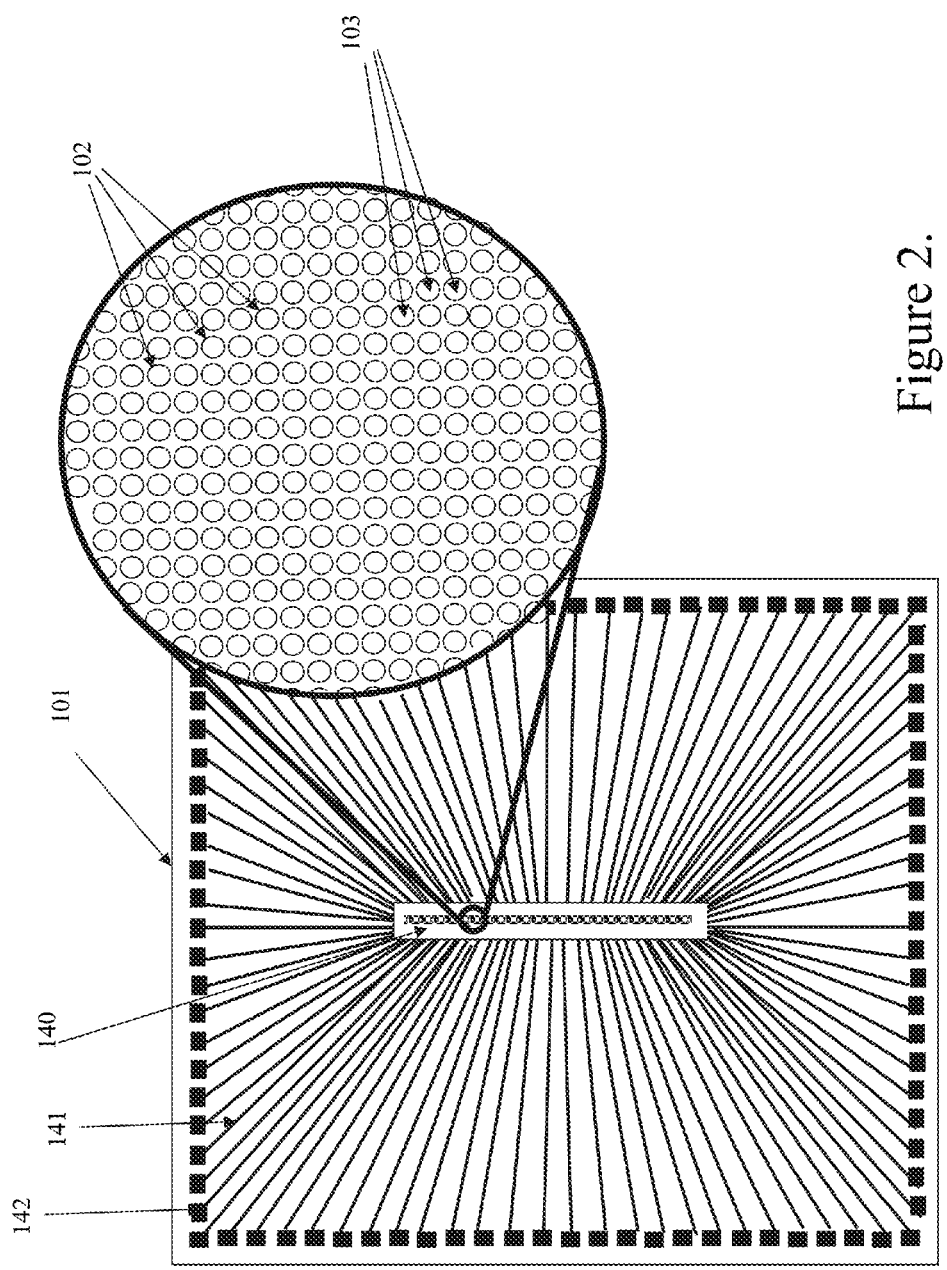
FIG. 2 is plan view of a DPG device according to the present invention.
Figure 3:
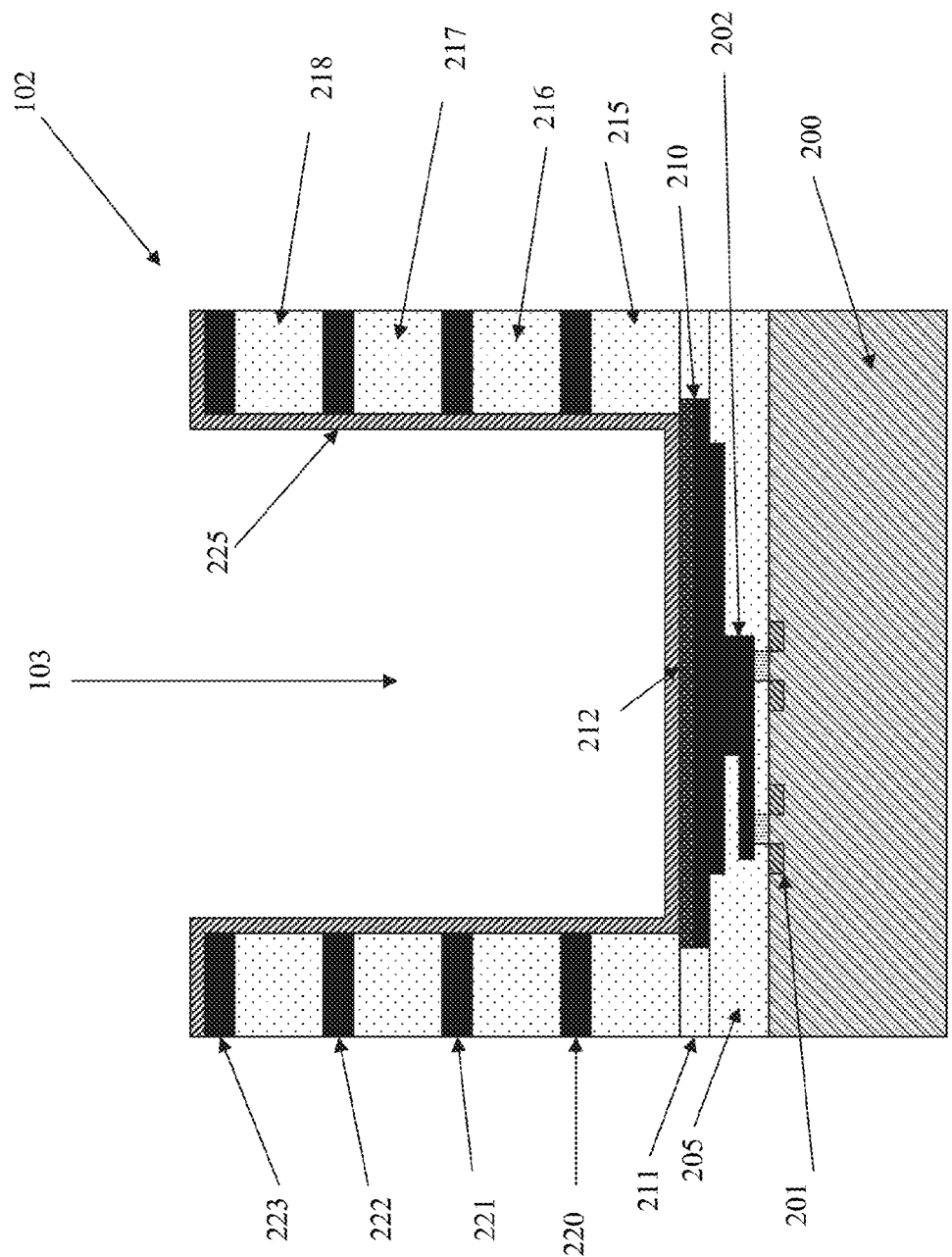
FIG. 3 is a cross-sectional view of a single pixel or column of the DPG device with integrated electronics according to the present invention.

A plan view of an illustration of the DPG device die 101 is shown in FIG. 2, and a cross-sectional view of a single pixel or column of an integrated DPG device is shown in FIG. 3. The DPG device active area is in the center 140 of the DPG device die 101 and has an array 140 of DPG pixels or columns 102 wherein each pixel or column 102 is a cylindrical-shaped trench 103 in the surface of the DPG device die active area 140. The DPG device 101 can be made with microelectronics 201 previously fabricated on the substrate for addressing the pixels 102 in the DPG device array 140, or alternatively the DPG device 101 can be fabricated on a substrate 200 without any active electronic transistors. The DPG device 101 with electronics 201 is called an "integrated DPG device," and the DPG device 101 without electronics is called a "non-integrated DPG device." Typically, a non-integrated DPG device will use off-die electronics to address the pixels 102 in the DPG device 101 and because of this, the size of the DPG array 140 on the DPG device for the non-integrated DPG device may have a smaller number of pixels 102.

In the integrated DPG device 101, the microelectronics 201 are located underneath the active DPG device area 140 of the DPG device die 101. The microelectronics 201 will have electrical connections 202 between bottom electrodes 210 of the DPG pixel 102 elements and the underlying microelectronics 201 and these electrical connections 202 will be made as part of the DPG device 101 fabrication. The microelectronics 201 may also have electrical connections to each of the metal electrode layers 220, 221, 222, and 223 in the DPG device 101 and these connections may be made as part of the DPG device 101 fabrication.

Additionally, the microelectronics will have electrical leads 141 that connect bond pads 142 on the edge of the DPG device die 101 to the microelectronics 201 under the DPG active device area 140. It should be noted that the size, format, number of electrical leads, and bond pads shown in FIG. 2 is only illustrative and the numbers for each of these can vary depending on the number of pixels 102 in the DPG device array 140, the type of microelectronics 201 process used, and other factors. That is, the number of pixels or columns 102 and the size of the active area 140 in a DPG device die 101 can be increased or decreased as desired. A larger active area and larger number of pixels or columns 102 in a DPG device die 101 provides for the modulation of a larger number of electron beams 120 and thereby an increased direct writing rate. Conversely, a smaller active area and larger number of pixels or columns 102 in a DPG device die 101 provides for the modulation of a smaller number of electron beams 120 and thereby a decreased direct writing rate.

In the non-integrated DPG device 101, the bottom electrodes and each of the highly electrically conductive electrode layers 220, 221, 222, and 223 will be electrically connected to bond pads 142 at the edge of the DPG device die 101 using electrical interconnects 141.

The integrated DPG device 101 is fabricated by depositing several alternating weakly electrically conductive layers 215, 216, 217, and 218 and highly electrically conducting layers 220, 221, 222, and 223 on the top surface of the silicon wafer 200 having previously fabricated CMOS or microelectronics 201 on the substrate surface 200. The DPG device design 102 typically uses four (4) highly electrically conductive layers 220, 221, 222, and 223 separated by four (4) weakly electrically conductive layers 215, 216, 217, and 218 fabricated on top of a base patterned highly electrically conductive layer 210, but a quantity of more or less highly electrically conductive electrode layers as well as a quantity of more or less weakly electrically conductive intermediate layers may be added or reduced as needed depending on the DPG device 101 performance desired. The number of layers required for the intended application is determined by the performance level required and the intended application. More layers in the DPG device 101 allows for a finer resolution of the e-beaming writing capability with the tool system 100. A charge dissipating coating or layer 225 is deposited onto the surface of the device 101.

The DPG devices 101 are fabricated onto CMOS technology substrates 200 that contain die nominally sized at 26-mm square although other sizes can be implemented. A top metal layer 210 on the CMOS wafers 200 is nominally formed into a regular array of circular metal pads ~1.3 to 1.4-micron in diameter with a pitch of 1.6-micron although other dimensions can be implemented as well. Nominally, these pads 210 would be made of Copper although other highly electrically conductive material layers will work as well depending on the materials and technologies used in the microelectronics fabrication process. These highly electrically conductive pads 210 are normally protected by a passivation layer 211 as part of the microelectronics manufacturing process that is removed from the pad surfaces before fabricating the DPG device structure 102. A suitably highly electrically conductive protection layer 212 may be included on top of the highly electrically conductive pad 210 to prevent corrosion of this material layer 210 and make electrical contact to this layer 210 as needed.

Figure 4:
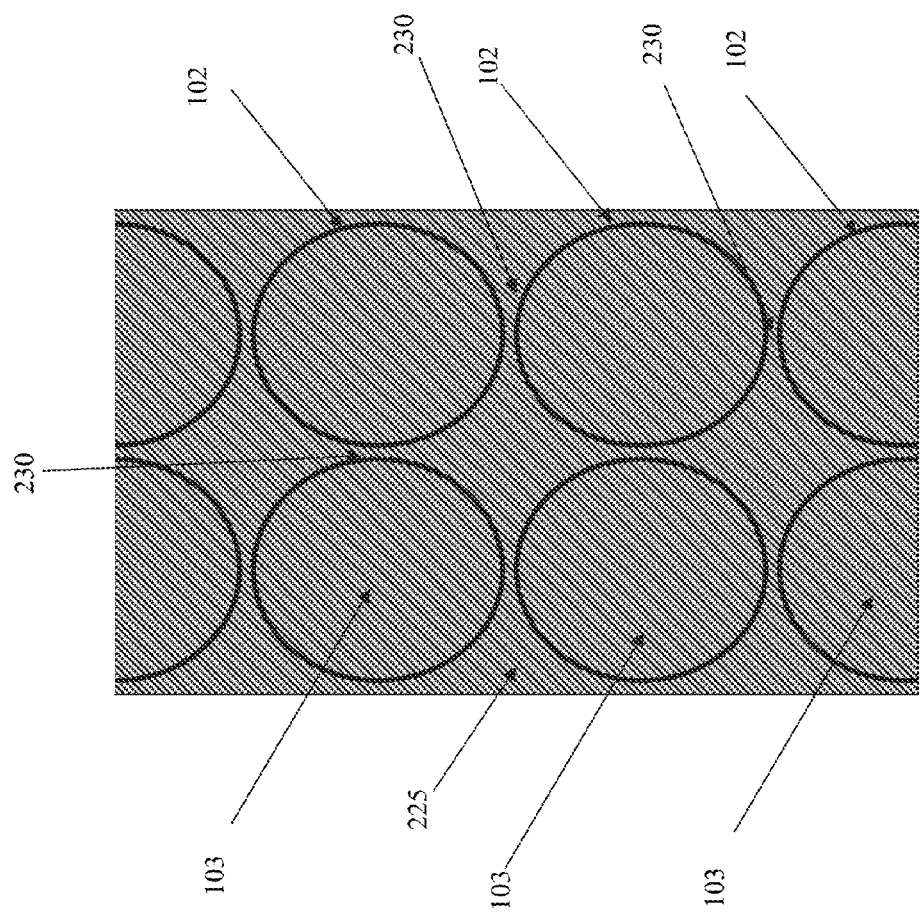
FIG. 4 is a close-up plan view of the DPG device according to the present invention.

The DPG device structure 102 consists of an array of cylindrical trenches 103 in a stack of highly electrically conductive and weakly electrically conducting materials as described below. The cylindrical trench pattern 103 is aligned with the pre-fabricated metal pads 210 of the CMOS chip 200 using appropriate alignment marks. Each of these cylindrical trenches 103 and the associated layer stacks and electronics is called a "pixel" or a "column," 102 and the DPG device 101 is composed of a regular array 140 of these cylindrical trenches 103, comprising individual pixels 102, numbering over 1 Million individual pixels 102 on a 1.6-mm pitch or approximately 6.7-mm by 0.5-mm at the center of a 26-mm by 26-mm chip, although other sized arrays and dimension can be implemented as well. A top down view of a few pixels 102 of a DPG device 101 is shown in FIG. 4.

Figure 5:
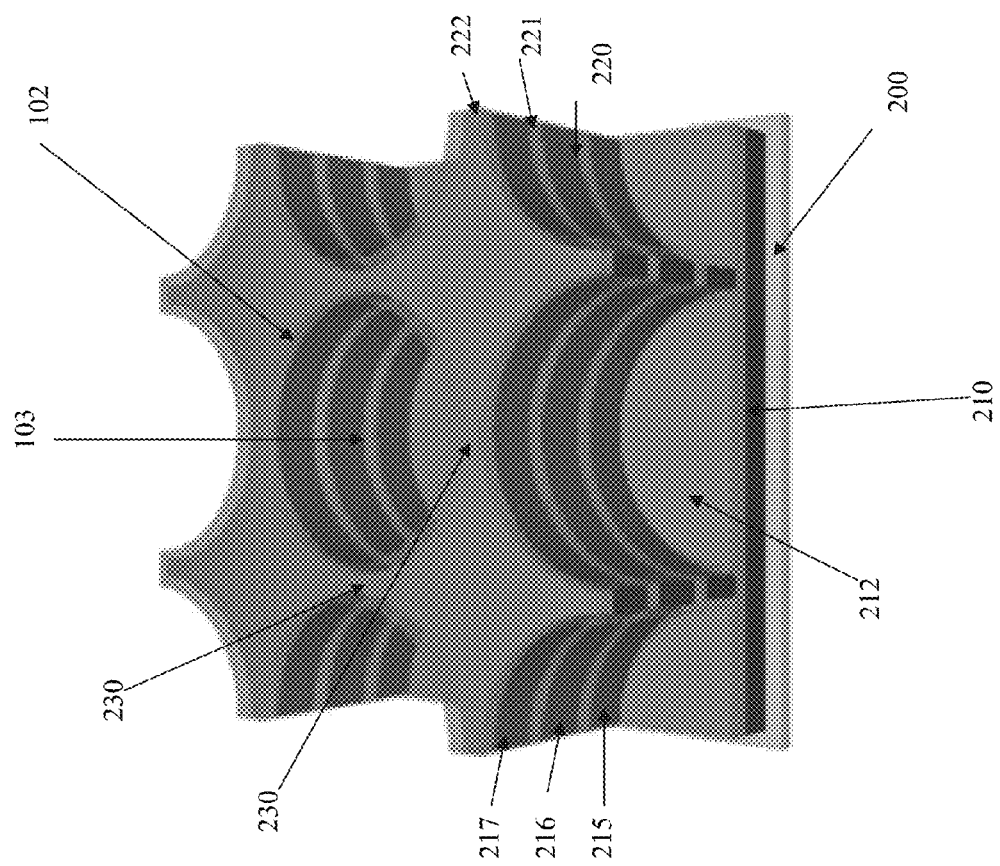
FIG. 5 is a three-dimensional cut-away view of the DPG device according to the present invention.
Figure 6C:
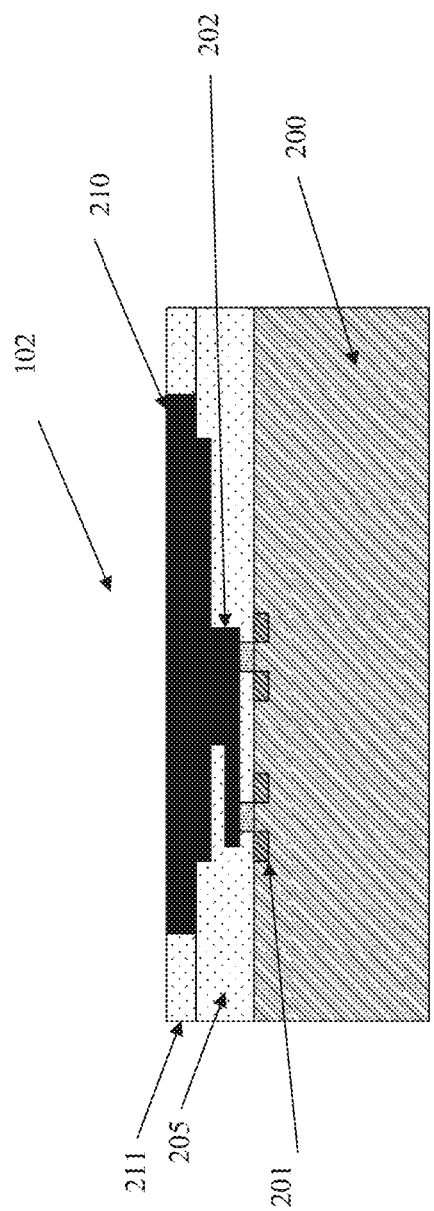
FIGS. 6.*a* through 6.*n* are cross-sectional views of an integrated DPG device at various stages of the fabrication process according to the present invention.
Figure 6D:
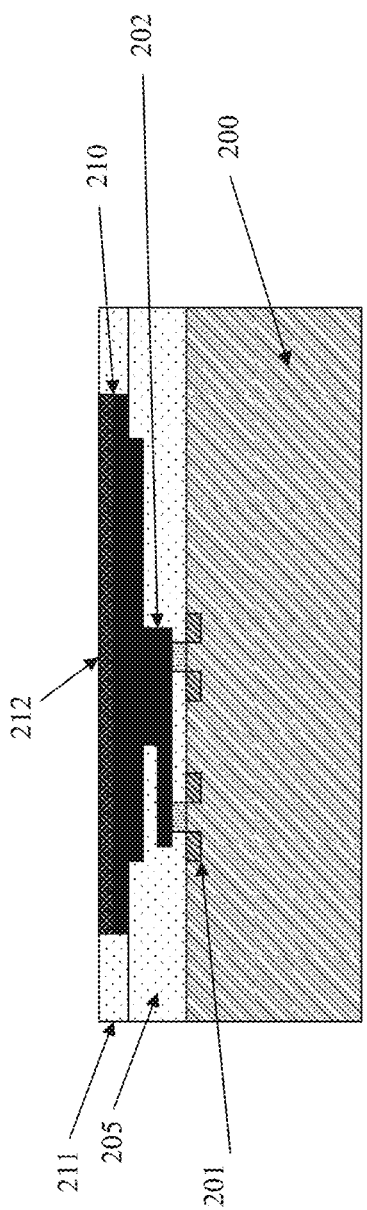
Figure 6E:
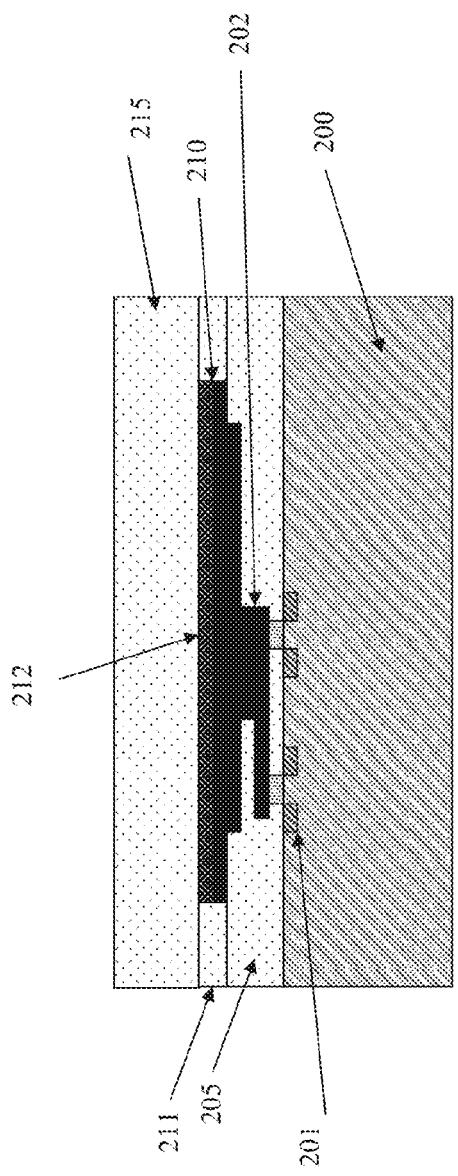
Figure 6F:
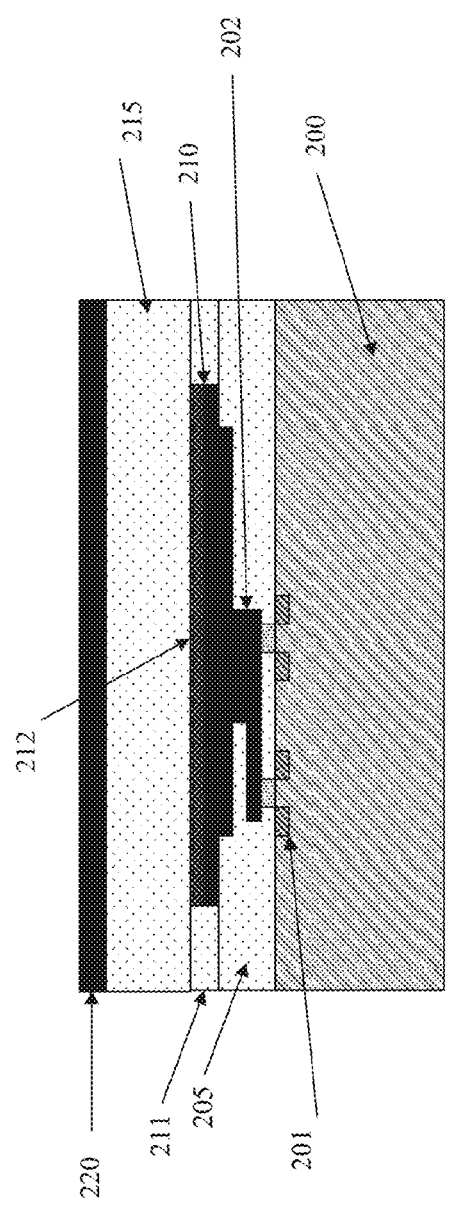
Figure 6G:
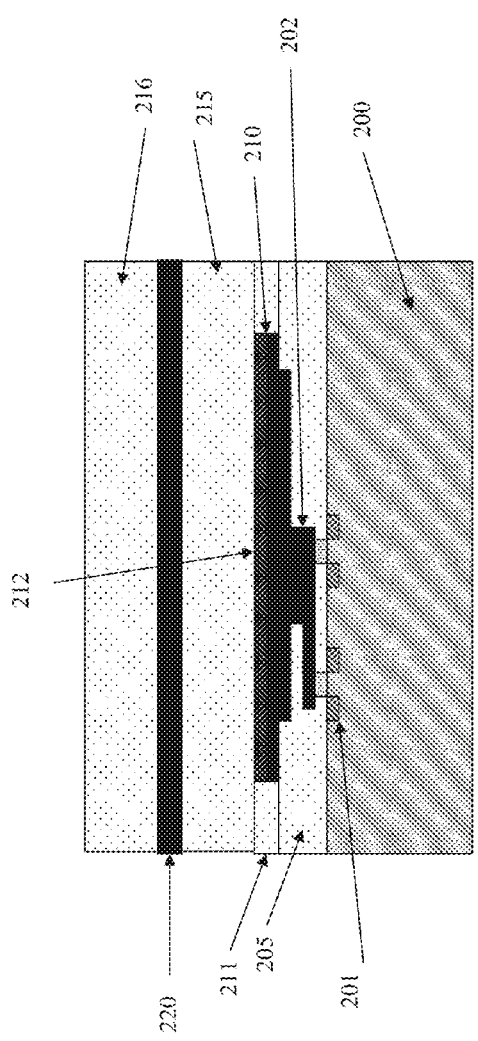
Figure 6H:
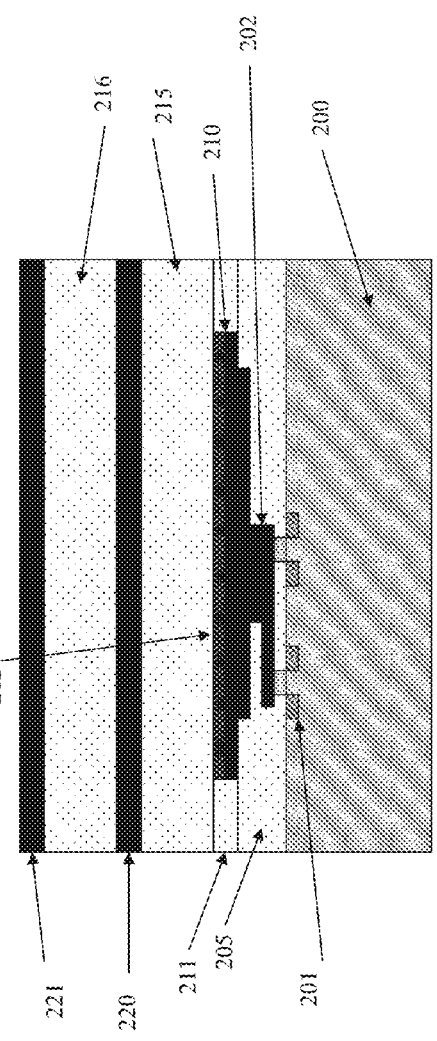
Figure 6I:
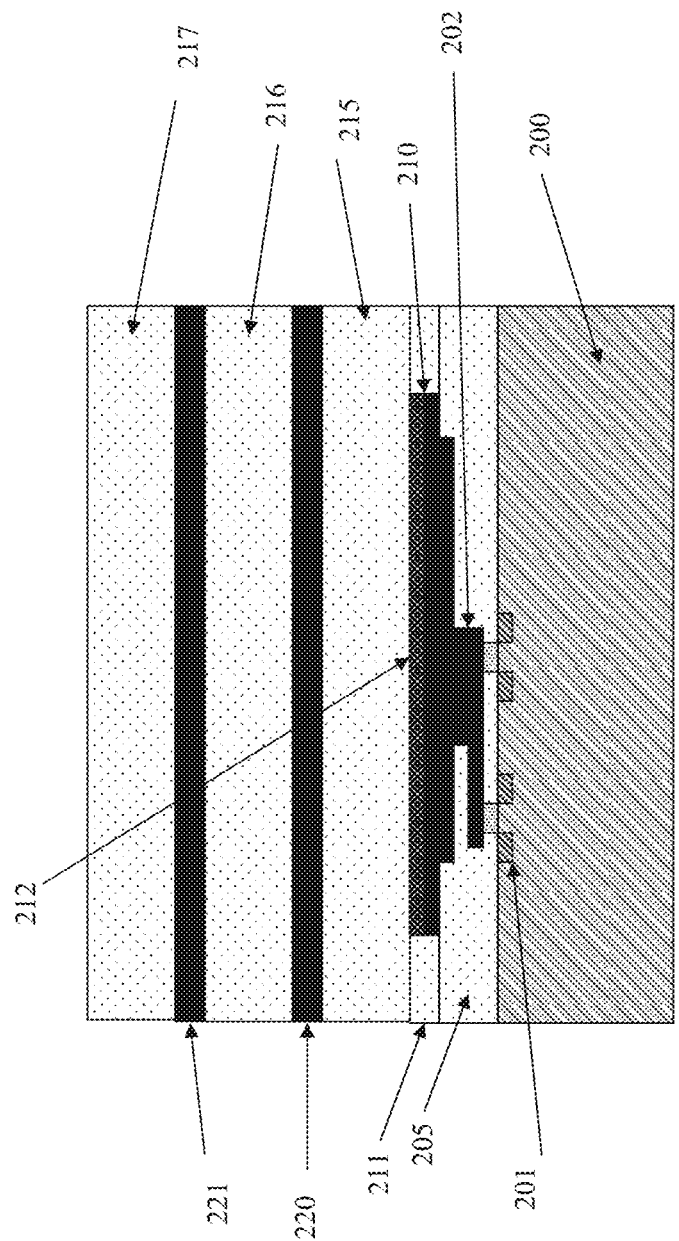
Figure 6J:
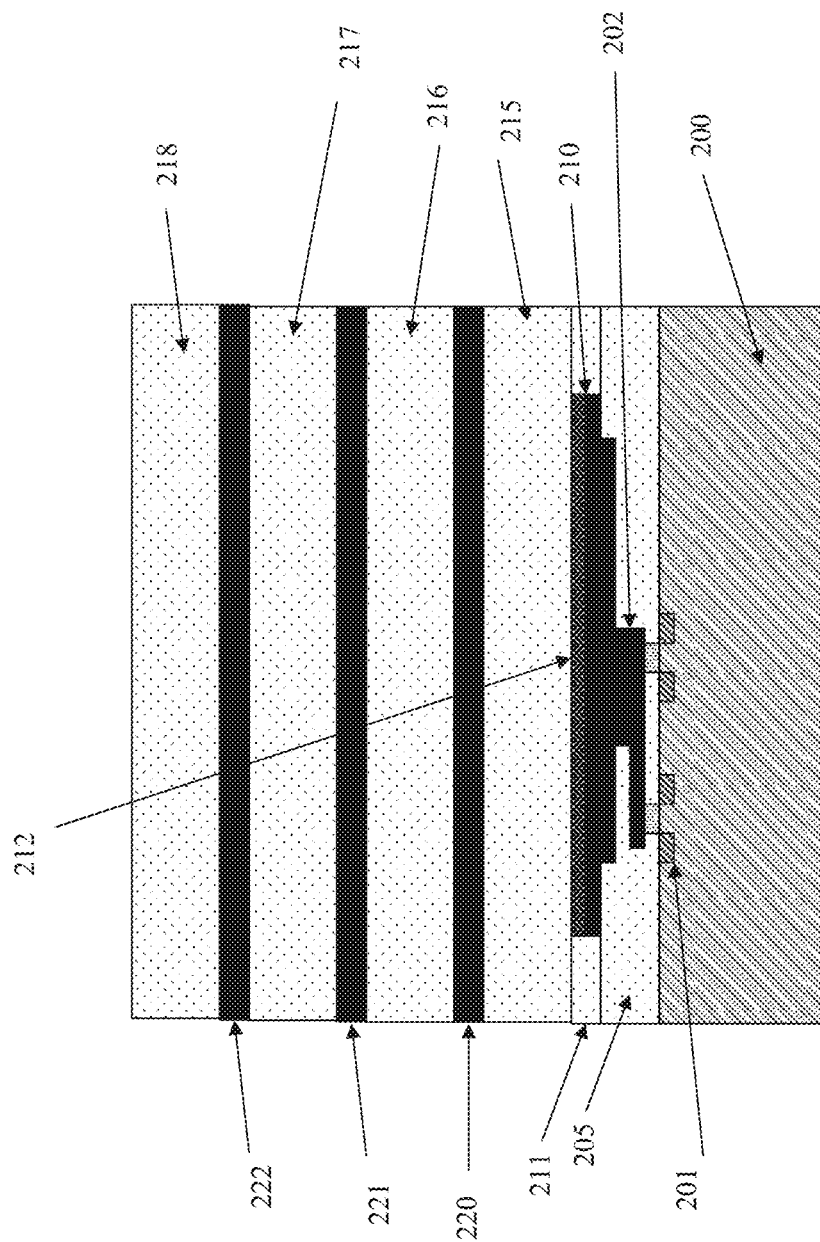
Figure 6K:
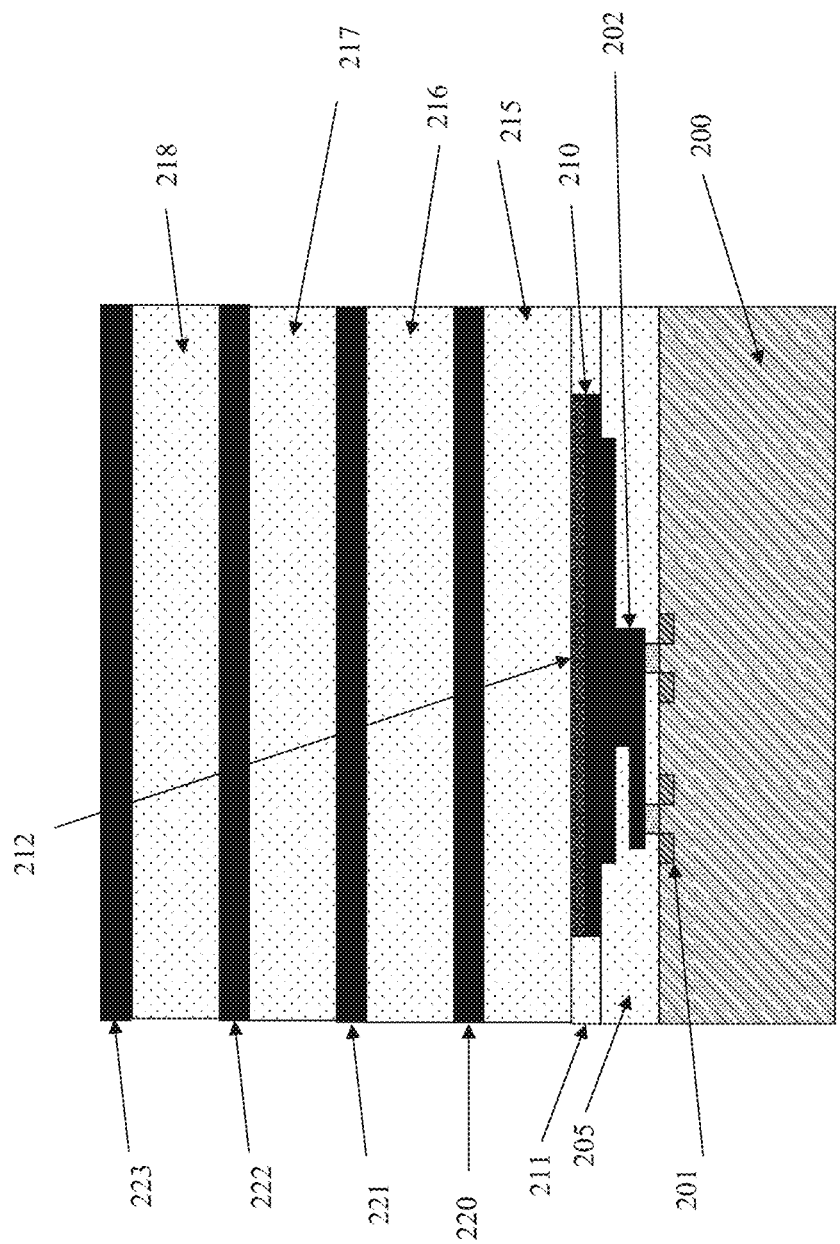
Figure 61:
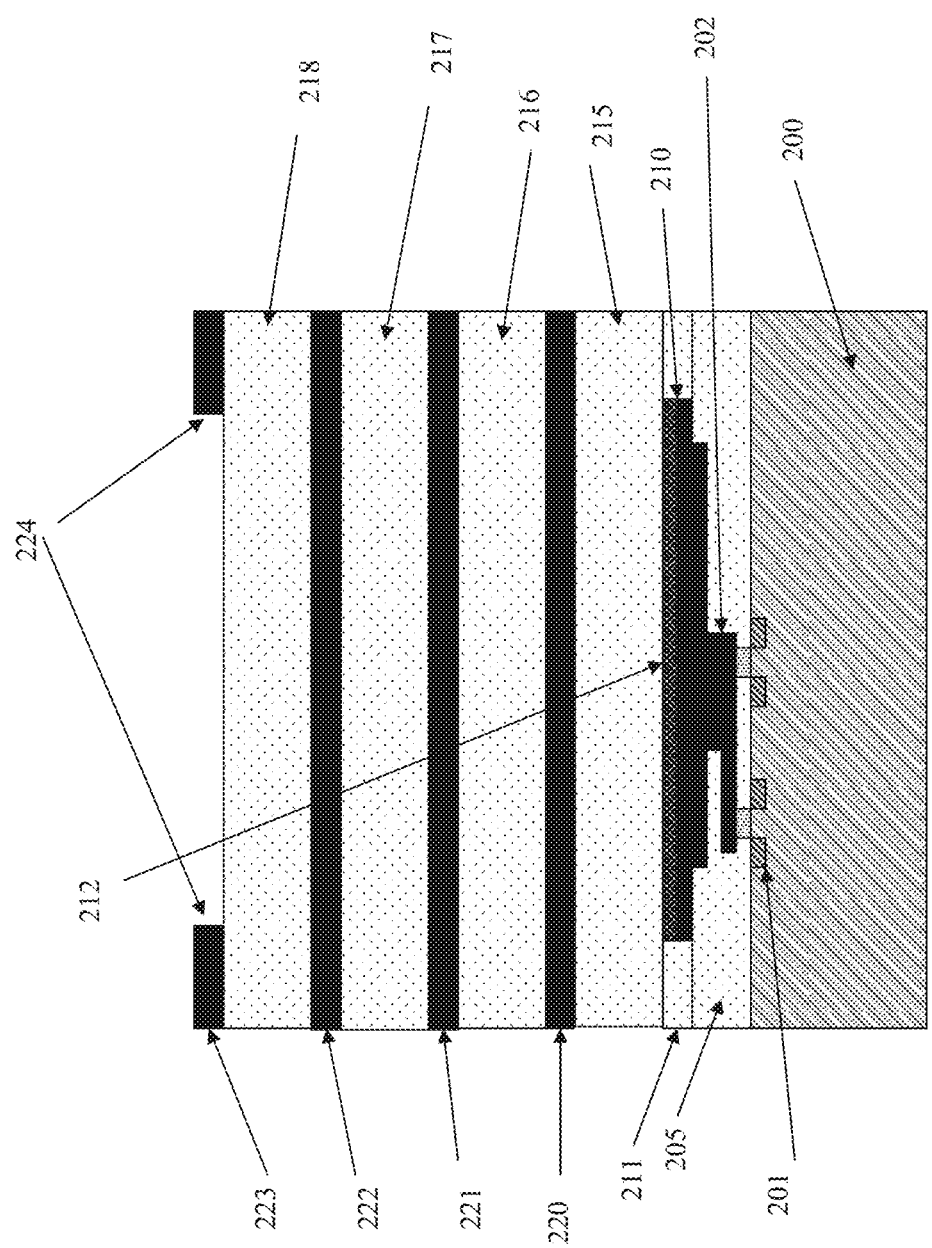
Figure 6M:
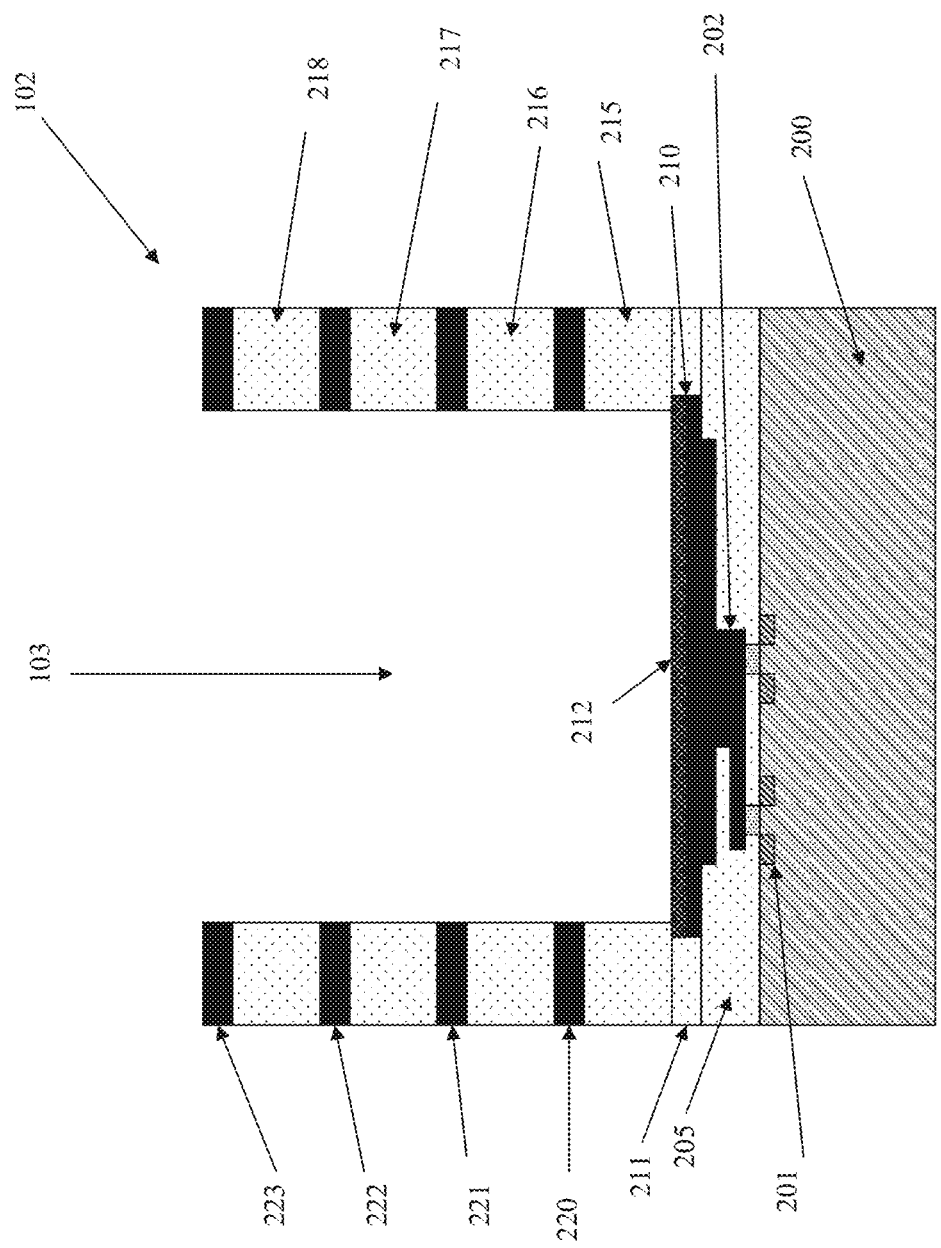
Figure 6N:
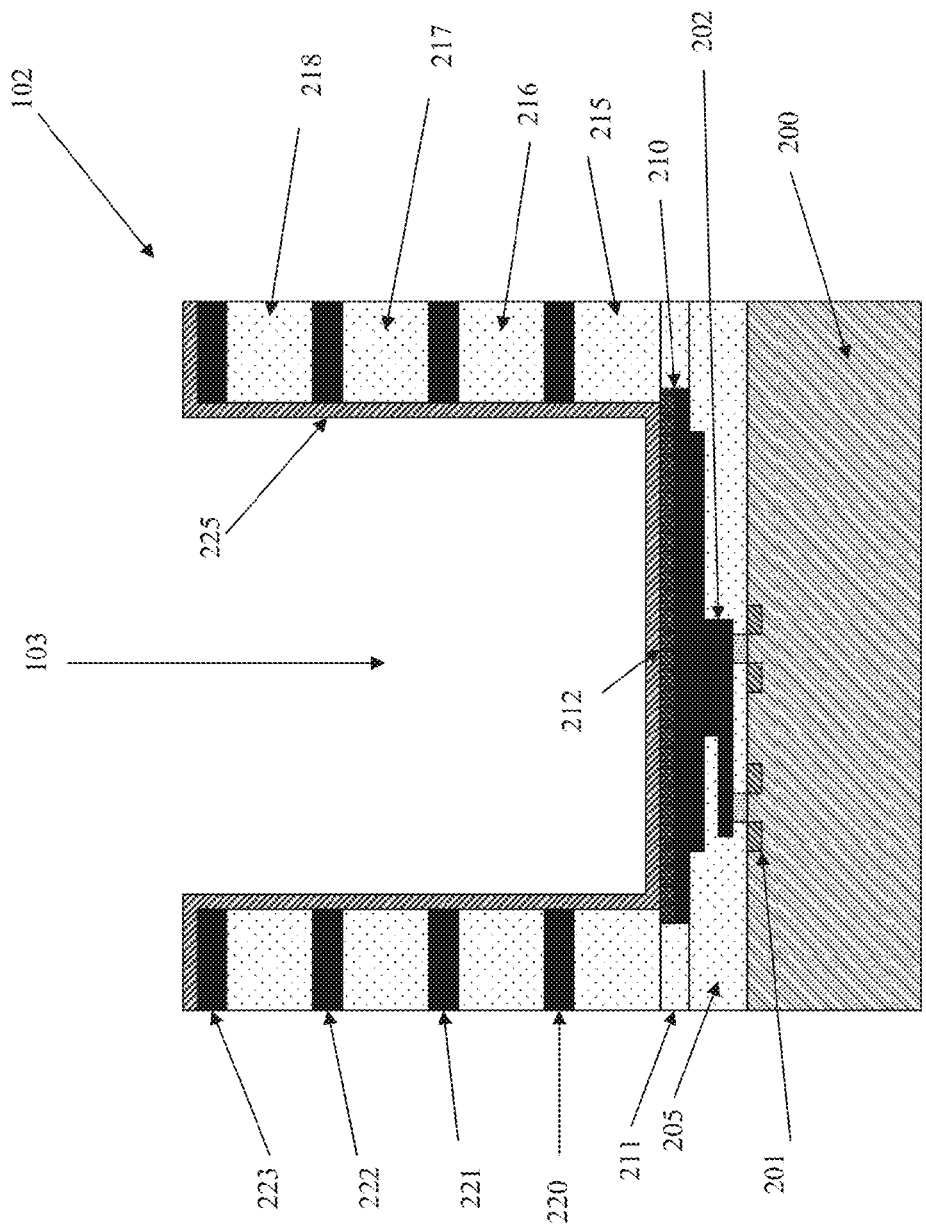
Figure 7A:
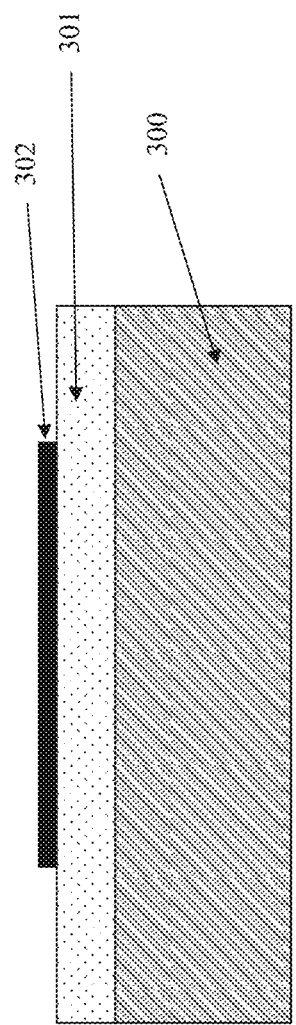
FIGS. 7.*a* through 7.*l* are cross-sectional views of a non-integrated DPG device at various stages of the fabrication process according to the present invention.
Figure 7B:
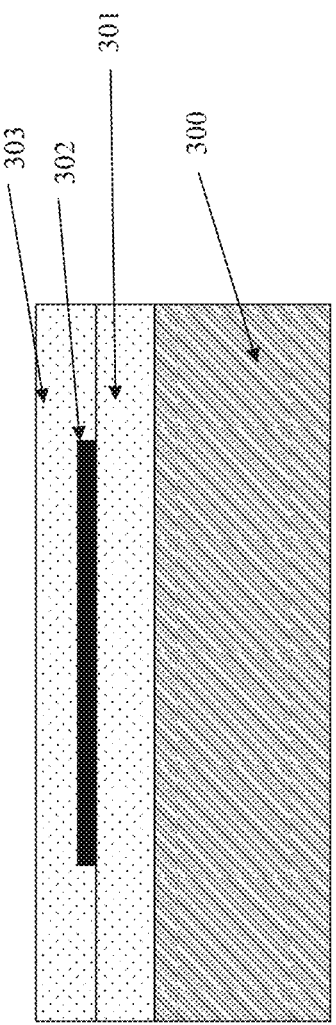
Figure 7C:
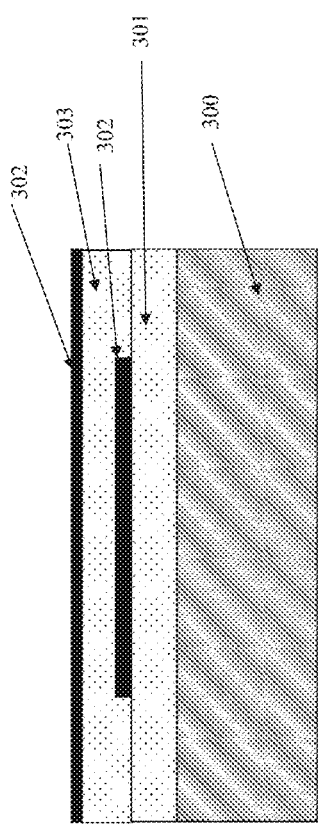
Figure 7D:
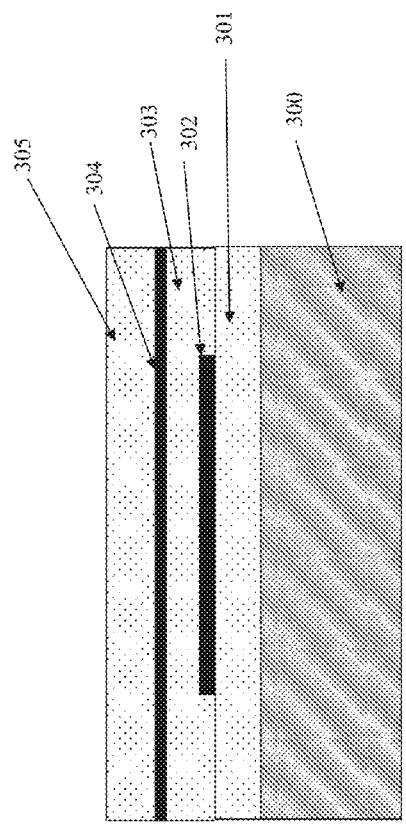
Figure 7E:
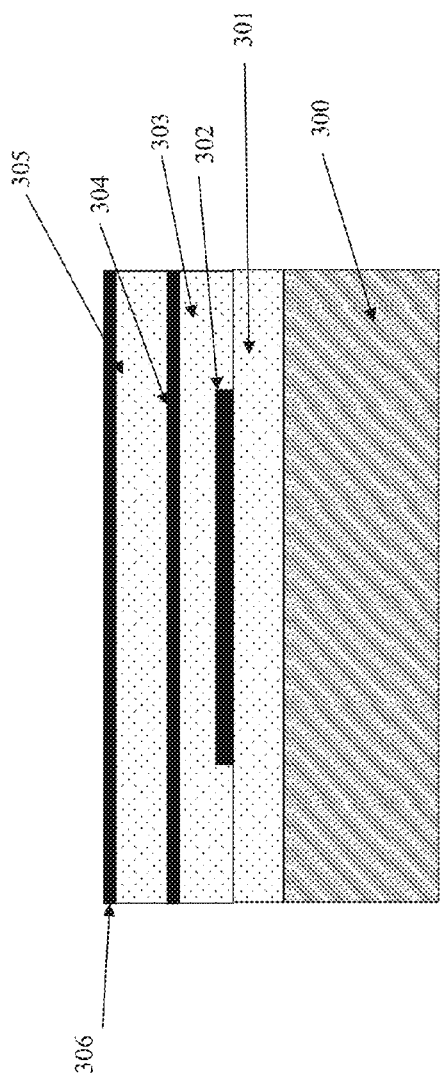
Figure 7F:
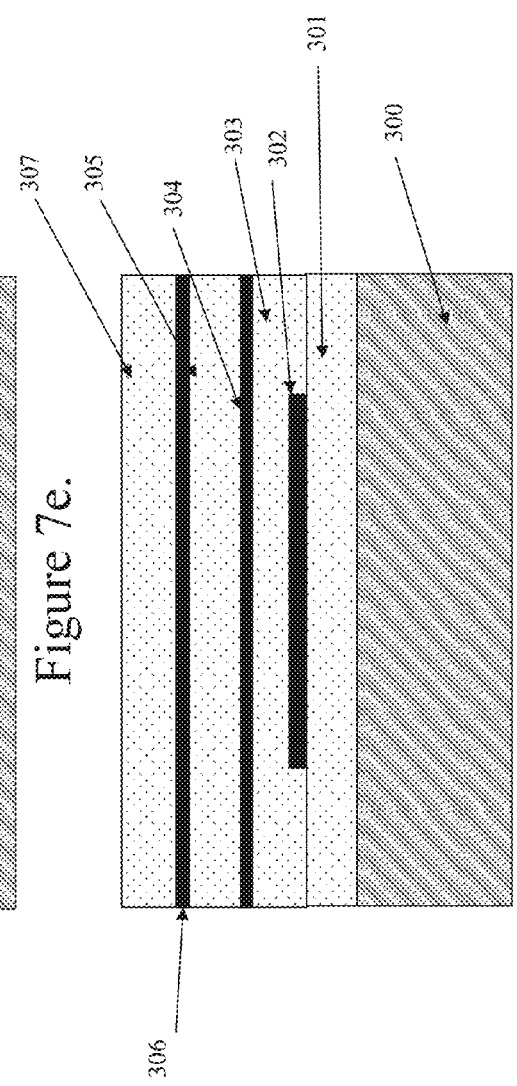
Figure 7G:
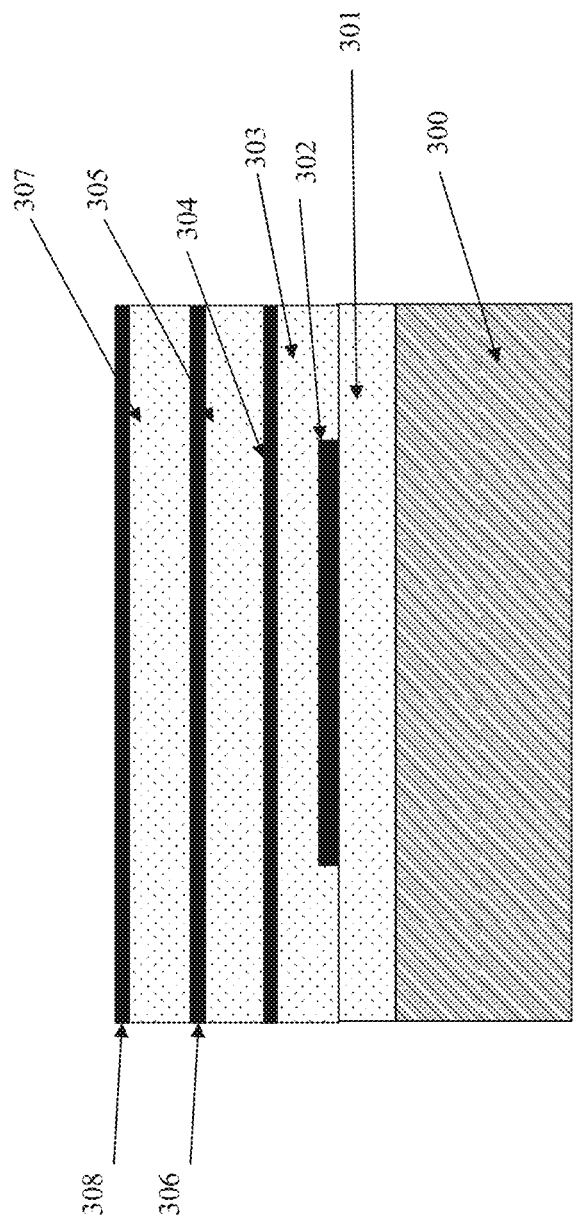
Figure 7H:
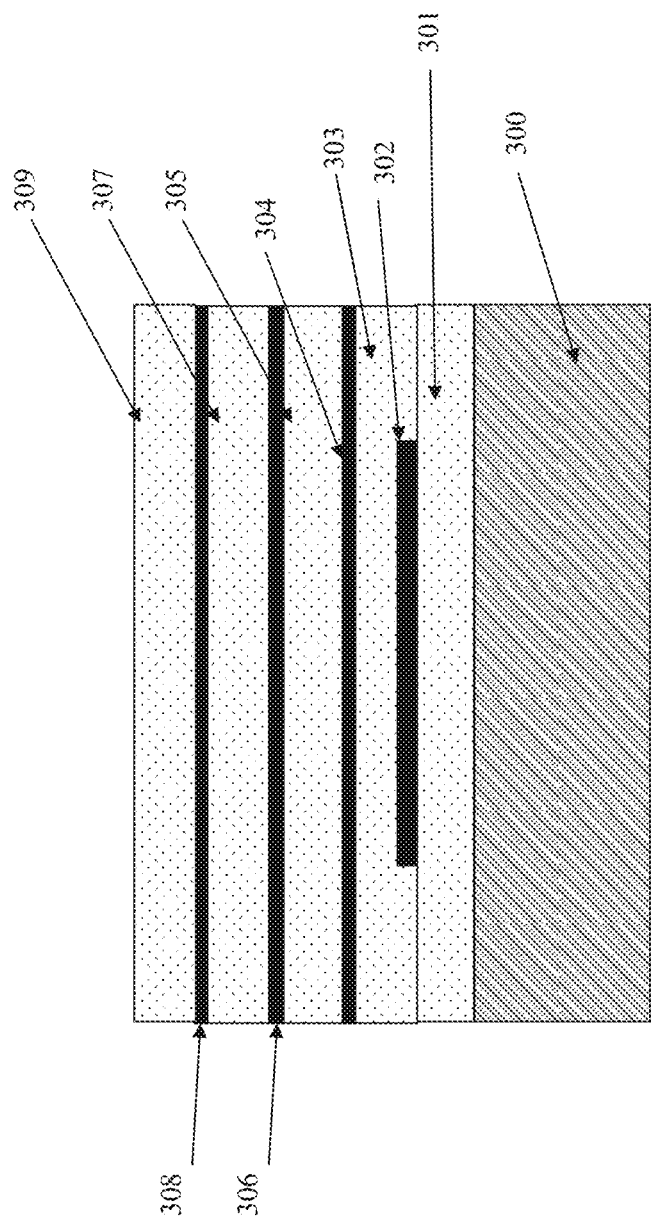
Figure 7I:
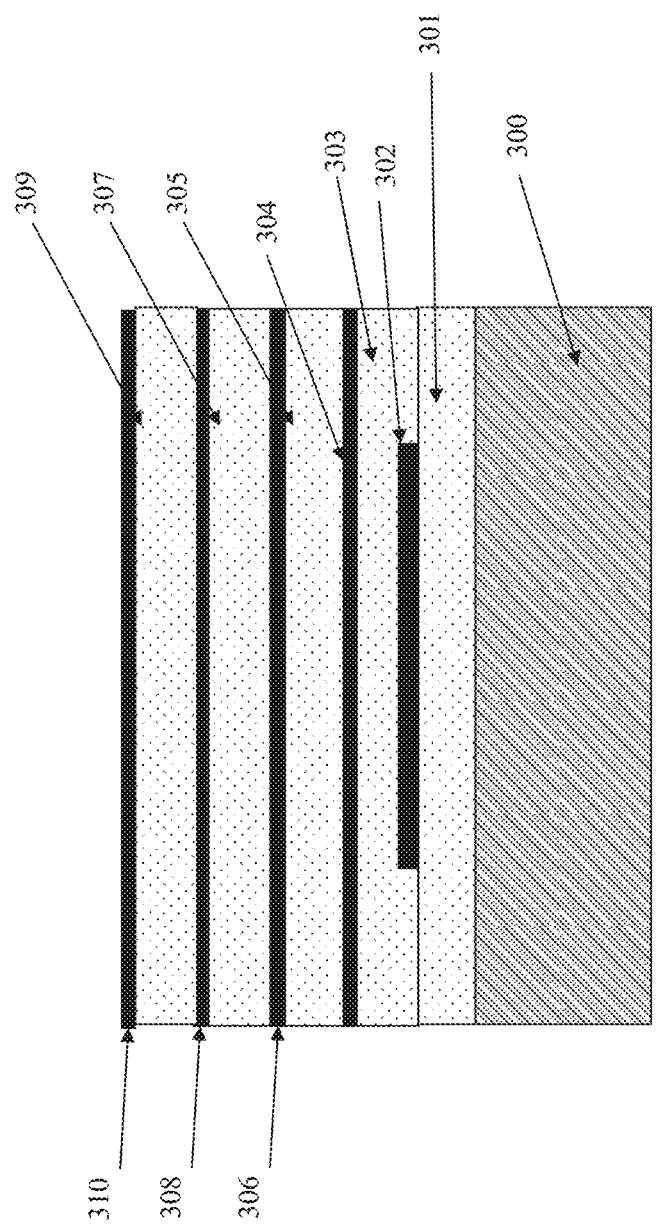
Figure 7J:
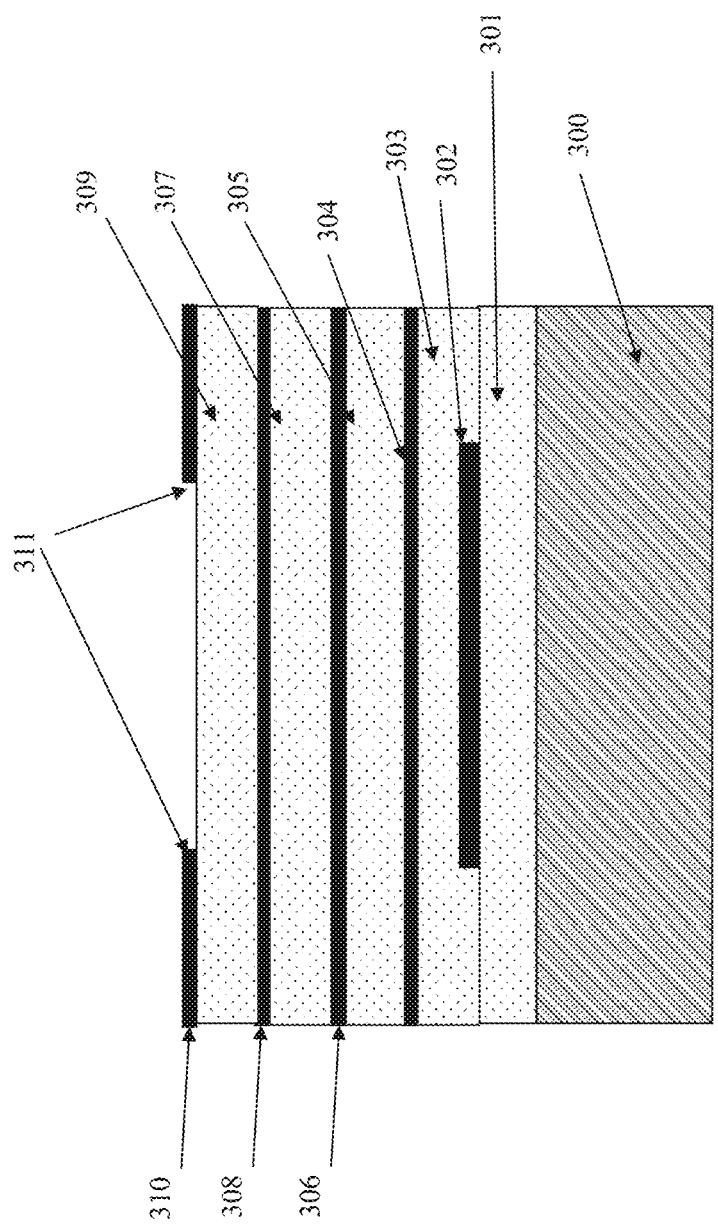
Figure 7K:
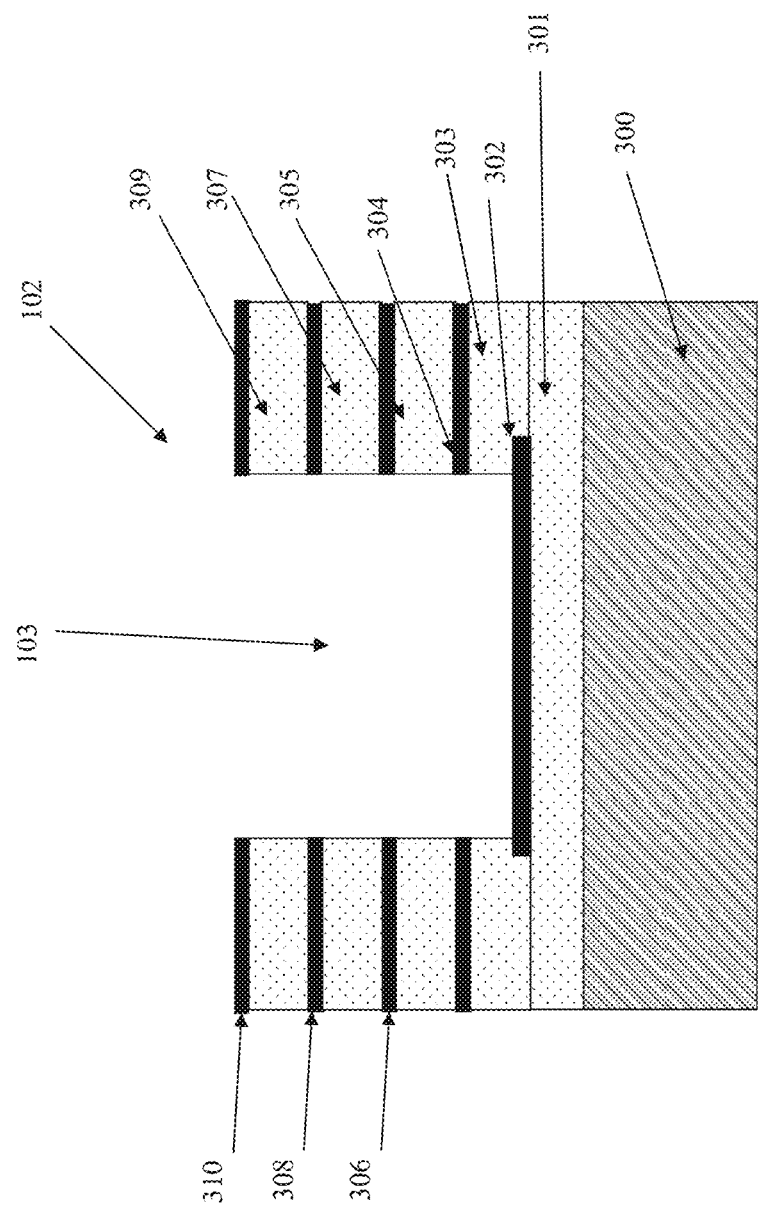
Figure 7I:
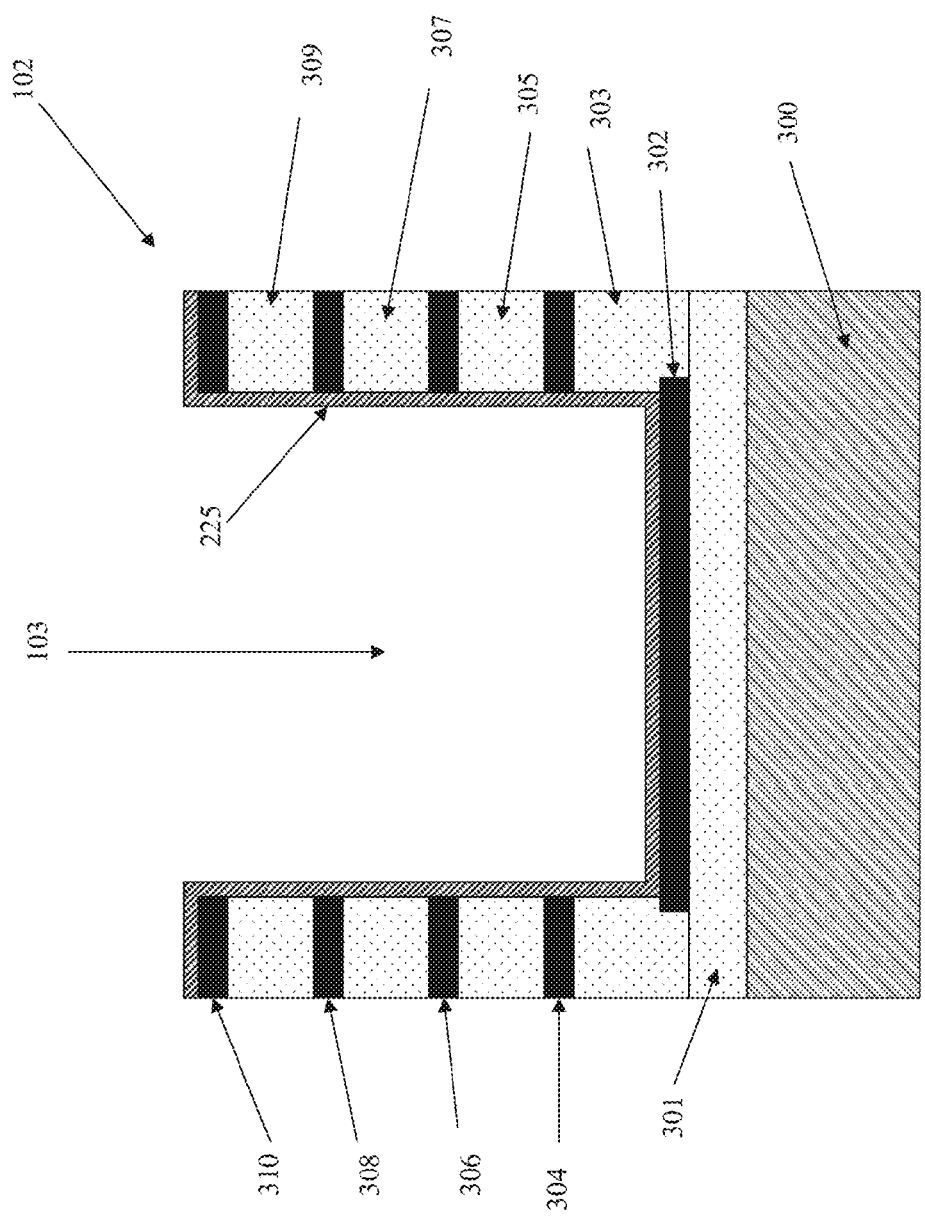

A three-dimensional view of a small section of a DPG device 101 showing a perspective of a single pixel is shown in FIG. 5. In FIG. 5, the DPG pixel 102 of the DPG device 101 has 3 metal electrode layers, whereas the DPG pixel 102 shown in FIG. 2 has 4 metal electrode layers. Also, the charge dissipating layer 225 is not shown in FIG. 5.

The array for the DPG device 101 comprises an array of 4375 by 625 pixels 102, although other sized arrays 101 can be used as well. The CMOS electronics 201 for each DPG device 102 in the DPG array 101 has an "active" array of 4096 by 248, although other active DPG array 101 sizes can be used as well. The DPG pixel array 140 may employ "buffer" pixels 102 at the edges of the array 140 to mitigate edge effects. The nominal cylindrical trench sizes and material requirements can be found in Table 1 in high-level form and in more detailed form in Table 2. Note that other sized arrays for the DPG devices 101 and other dimensions for the DPG pixels 102 can be used depending on the application and the performance level required.

All of the highly electrically conductive layers 220, 221, 222, and 223 of the DPG device 101 are approximately 100-nm thick, although other thicknesses can be used and still meet the DPG device 101 requirements. The weakly electrically conductive layers 215, 216, 217 and 218 separating the highly electrically conductive layers 220, 221, 222, and 223 nominally have a thickness range of ~0.5 to 1.0 micron depending on the total number of layers, the device 101 requirements, and the design and tested performance of the DPG device 101, but other thicknesses can be used.

An Atomic Layer Deposition (ALD) conformal charge-dissipating coating 225 with a nominal resistivity of $>1\times10^{10}$ Ohms/sq may be used to coat the structure including the interior of the cylindrical trenches 103. The purpose of this conformal resistive coating 225 is to make the sidewalls of the cylindrical trenches 103 of the DPG device 101 partially conductive. This charge-dissipating coating 225 is used when the intermediate layers 215, 216, 217 and 218 separating the highly electrically conductive layers 220, 221, 222, and 223 in the DPG device 102 material layer stack are made from an electrically insulating material such as silicon dioxide. It is preferred that the conformal coating 225 is not deposited or is stripped from the device 101 top surface; however, this may not be necessary.

The cylindrical trench 103 inner wall and upper surfaces should not have any material deposits associated with process by-products, accumulated impurities, re-deposited matter, and products of layer-to layer chemical interaction or from any other sources in the amounts affecting the electrical or geometry parameters specified above by more than 10%.

Inter-cylindrical trench separating walls 230 of the DPG device 101 should not be mechanically damaged. It is desirable that the minimum wall 230 thickness separating cylindrical trenches 103 be as small as possible (nominally 100-nm although other dimensions are possible depending on the intended application and performance level required) in order to maximize the fill factor of the DPG device 101 array 140 but this is limited by lithography and processing.

The self-aligned approach to the implementation of the self-aligned DPG of the present invention offers critical advantages compared to non-self-aligned approaches for implementing the DPG device 101.

Specifically, the self-aligned fabrication approach (FIGS. 7 and 8) greatly simplifies the complexity, risk and cost of the fabrication sequence. This is due to the large reduction of the number of expensive high-resolution lithography steps to only two, namely for the bottom layer 210 or 212 and 302 and the top electrode layer 223 and 310 (which also serves as the hard mask for the ICP etch), as opposed to 5 or more expensive high-resolution lithography steps in the non-self aligned approach.

Additionally, the self-aligned fabrication approach does not require any chemical-mechanical planarization ("CMP") step to be performed in the process sequence. This is a simplification since CMP is a difficult and risky process step and also one that is expensive to perform. In contrast, a non-self aligned fabrication approach requires a CMP to be performed after each and every weakly electrically conductive layer in the stack to form the DPG. For a 5-layer DPG device 101, at least 4 CMP steps would need to be performed in the sequence.

Another benefit of the self-aligned fabrication approach is that it eliminates the need to perfectly align (register) each of the highly electrically conductive electrode layers to one another in the entire stack thereby allowing for higher performance DPG devices as well as higher manufacturing yields and further reductions in fabrication costs. The specification for the alignment of all the holes in the electrode layers forming the DPG multi-layer stack is 15 nm or less. This specification is relatively easy to meet for the self-aligned approach and nearly impossible to meet with a non-self aligned approach.

To understand why, we need to take this specification and the number of layers in the DPG device 101 structure that are patterned and calculate the required registration alignment accuracy of each individual electrode layer in the device structure using the root-sum-of-squares (RSS) analysis. With a random consecutive error for 5 electrode layers (including the four electrode layers in the DPG device stack plus the bottom DPG electrode) and a quantity of 4 individual alignments, the following RSS equation can be used to calculate the average required alignment accuracy for each layer in order to obtain a 15 nm or better alignment between all the highly electrically conductive electrode layers.

$$15\text{ nm} \geq \sqrt{N \cdot \Delta_s^2}, N=4 \Rightarrow \Delta_s \leq 7.5\text{ nm}$$

where N is the number of alignments, equal to 4 in the DPG devices structure, and $\Delta_s$ is the required alignment precision for each of the alignments of the electrode layers to one another. An alignment precision of better than 7.5 nm is extremely challenging even for the most sophisticated lithographic capabilities currently in existence.

In the self-aligned approach, the circular openings are automatically aligned to one another since the cylindrical trench 103 etch used to fabricate the DPG device 101 is performed using the same mask (top layer highly electrically conductive hard mask) 224 and 310 for the entire highly electrically conductive and weakly electrically conductive layer stack. When the etch is performed, all of the highly electrically conductive layers can only be perfectly aligned to one-another. Only the overlay alignment of the top highly electrically conductive layer 223 and 310 to the bottom electrode layer 210 or 212, and 310 is important and the required accuracy in this alignment is not very demanding since the device only requires that the cylindrical trench 103 completely overlays the bottom electrode 210 or 212 and 302. It is important to note that this alignment of the top highly electrically conductive layer 223 and 310 to the bottom highly electrically conductive electrode layer 210 or 212 and 302 must also be performed in the non-self aligned approach.

In short, the self-aligned fabrication approach (FIGS. 6 and 7) to implementing the DPG device 101 structure offers many advantages including: a reduction in the number of total fabrication steps in the process sequence; a large reduction in the number of expensive lithographic steps; no need for any expensive CMP steps; a simpler fabrication process; a higher yield with a commensurate lower cost; less fabrication risk; higher device performance; and more consistent device-to-device performance. Importantly, all of these benefits that result from the self-aligned approach do not come at any additional expense.

We also claim an invention based on what we term the "advanced" self-aligned DPG device 101 that eliminates the need for a charge dissipating coating 225 in the pixels or columns 102 of the DPG device 101.

Although we describe a DPG device 101 that is fabricated onto a CMOS substrate 200 it is noted that the DPG device 101 can also be fabricated onto a blank substrate as well. This may be preferable if the DPG device 101 array size 140 is relatively small and where the individual addressing of the pixel 102 in the DPG device 101 can be done using off-DPG die electronics. Therefore, the DPG devices 101 and method of implementation described herein cover both the integrated—(i.e., DPG device 101 made on a CMOS or other suitable microelectronics substrate) and non-integrated DPG devices 101 (i.e., DPG device made on a non-CMOS or other microelectronics substrate).

Self-Aligned DPG Device

The self-aligned DPG device 101 design and method of fabrication involves a multiplicity of alternating weakly electrically conductive insulating intermediate layers 215, 216, 217 and 218 (if it is a 4-layer DPG device 101) and highly electrically conductive layers 220, 221, 222, and 223 (again if it is a 4-layer DPG device 101) on the top surface of a suitable microelectronics substrate 200 (FIG. 3), without any lithography or etching of either the individual weakly electrically conductive layers or the individual highly electrically conductive layers after they are deposited in the area or location of the DPG device 101 where the array 140 of pixels 102 are located. As mentioned above, this is unlike a non-self-aligned DPG device fabrication process wherein each highly electrically conductive layer subsequent to the bottom electrode layer has lithography and etching performed on it to pattern circular openings entirely through the thickness of each highly electrically conductive layer.

Therefore, the key distinction between the non-self-aligned and self-aligned approaches to the fabrication of the DPG device 101, is neither the highly electrically conductive layers 220, 221, 222, and 223 nor weakly electrically conductive intermediate layers 215, 216, 217, and 218 are etched in the location of the DPG array 140 of the DPG device 101 until the end of the fabrication process for the self-aligned DPG devices 101, whereas each highly electrically conductive layer is etched as the stack is built up with more and more layers in the non-self-aligned DPG device. Consequently, the fabrication of the non-self-aligned DPG device requires an extraordinary level of precision on the layer-to-layer alignment in order to get the circular openings in each highly electrically conductive electrode layer to align to one another. In comparison, the required precision from layer-to-layer registration for the self-aligned DPG device is very relaxed.

The self-aligned DPG is typically fabricated onto a microelectronics substrate 200; that is, if the fabrication of the DPG device 101 is for an integrated DPG device, then the first step (FIG. 6.*a*) is to perform one or more lithography and etching steps on the top layer(s) of the microelectronics substrate 200 in order to open up vias 206 through the passivation layer(s) 211 and 205 on the surface of the substrate 200 to the underlying suitable highly electrically conductive layers 202 of the microelectronics substrate 200 directly at the locations of the pixels 102 in the DPG device 101 array (FIG. 6.*b*). The substrate 200 will have some microelectronics devices 201 fabricated in the substrate 200 that allow individual addressing of each of the pixels 102 in the DPG device 102 array.

Subsequently, a highly electrically conductive layer 210 is deposited into the vias 206 that is suitable for making good electrical contact to the metal(s) 202 used in the microelectronics device 201 process (FIG. 6.c) made onto the substrate 200. After forming these highly electrically conductive layers 210 through these vias 206, the surface of the highly electrically conductive layers 210 and the passivation layers 211 on the surface of the microelectronics substrate 200 may have a Chemical-Mechanical Polishing (CMP) step performed in order to planarize the surface of the substrate 200.

Subsequently, a highly electrically conductive layer 212 different from the via filling metal 210 may be deposited and have lithography and etching performed on it to form the bottom electrode layer in order to facilitate the DPG device 101 functioning and fabrication (FIG. 6.d). Alternatively, upon depositing and patterning highly electrically conductive layers 212, the surface of the highly electrically conductive layers 212 and the passivation layers 211 on the surface of the microelectronics substrate 200 may have a Chemical-Mechanical Polishing (CMP) step performed in order to planarize the surface of the substrate 200.

Subsequently, a weakly electrically conductive intermediate layer 215 is deposited onto the substrate 200 to form a continuous blanket layer to coat the substrate 200 surface (FIG. 6.e). Although it is usually not needed since the surface has already been planarized, this weakly electrically conductive layer 215 may have CMP performed on it to planarize the surface of the weakly electrically conductive material layer prior to deposition of the next highly electrically conductive layer in the stack in order to facilitate performing lithography and etching later in the fabrication process sequence.

Subsequently, in the integrated self-aligned DPG device 101 fabrication another highly electrically conductive layer 220 is deposited on the exposed intermediate layer 215 surface of the substrate 200 (FIG. 6.f) and this highly electrically conductive layer 220 is referred to as a DPG device 101 electrode layer. This layer of highly electrically conductive is deposited 220 as a continuous layer and may not have lithography and etching performed on it in the locations of the DPG device die 101 where the pixels are located.

In the integrated self-aligned DPG fabrication, next another blanket weakly electrically conductive intermediate layer 216 is deposited onto the highly electrically conductive layer 220 to form a continuous blanket layer to coat the substrate surface 200 (FIG. 6.g).

Subsequently, in the integrated self-aligned DPG device 101 fabrication another highly electrically conductive layer 221 is deposited on the exposed intermediate layer 216 surface of the substrate 200 (FIG. 6.h) and this highly electrically conductive layer 221 is referred to as a DPG device 101 electrode layer. This layer of highly electrically conductive is deposited 221 as a continuous layer and does not have lithography and etching performed on it in the locations of the DPG device die 101 where the pixels are located.

Using this sequence of events, that is, depositing a weakly electrically conductive intermediate layer 217 and 218, followed by a highly electrically conductive layer deposition 222 and 223, is repeated as many times as required (FIGS. 6.i and 6.j) to obtain the number of highly electrically conductive layers and weakly electrically conductive layers desired in the self-aligned DPG device 101 structure. Importantly, at this point only the bottom highly electrically conductive layer 210 has been patterned and etched at the location of where the DPG device array 140 is on the DPG die 101. That is, both the multiple highly electrically conductive layers 220, 221, and 222 and 223, and weakly electrically conductive layers 215, 216, 217, and 218 in the DPG device 101 layer stack are unpatterned and unetched at the location of where the DPG device array 140 is located.

After the last and topmost highly electrically conductive layer 223 is deposited (FIG. 6.k), it has lithography performed on it, and is etched to form circular openings 224 (FIG. 6.1) for the DPG array 140. Subsequently an Inductively-Coupled Plasma (ICP) etch or similar anisotropic etch is performed so as to etch through the entire stack of weakly electrically conductive layers 215, 216, 217, and 218 and highly electrically conductive layers 220, 221, and 222 and stopping on the bottom highly electrically conductive layer 210 or 212 (FIG. 6.m) to form a cylindrical trench 103 at the locations of the DPG pixels 102.

The ICP etch used to form the cylindrical trenches preferably will be capable of a very high-aspect ratio etch through the stack of weakly electrically conductive layers 215, 216, 217, and 218 and highly electrically conductive material layers 220, 221, and 222.

Alternatively, the substrate is subsequently placed in a suitable ICP or RIE etch system to etch through the topmost weakly electrically conductive intermediate layer 218, then placed into a suitable ICP or RIE etch system to etch through the highly electrically conductive layer 222 below the topmost weakly electrically conductive intermediate layer, and then placed in a suitable ICP etch system to etch through the next weakly electrically conductive intermediate layer 217, and on and on, until the bottom highly electrically conductive electrode layer 210 or 212 has been reached.

It should be noted that an additional masking material layer (not shown in FIG. 6) may be deposited and patterned into the shape of the circular openings 224 on top of the highly electrically conductive layer 223 to act as a better protection during the cylindrical hole etch.

The material choices for the deposited highly electrically conductive layers 210, 212, 220, 221, 222, and 223 can include: platinum; Titanium-Tungsten; Aluminum; Titanium; Nickel; Copper, and other metals. Alternatively, a conductive semiconductor (e.g., doped Silicon, Germanium, etc.) or electrically conductive ceramic material layers (e.g., Titanium-Nitride) can also be used for the highly electrically conductive electrode layers.

The highly electrically conductive layers can be deposited by physical vapor deposition (PVD), either evaporation or sputtering, as well as Chemical Vapor Deposition (CVD) as well as Atomic Layer Deposition (ALD). The top most highly electrically conductive layer can also be deposited using electroplating into a suitably defined polymer mold that can be subsequently removed in which case the top most highly electrically conductive layer is defined by the polymer mold and no etch of the top most highly electrically conductive layer is required.

A silicon dioxide (SiO2) can be used as the weakly electrically conductive intermediate layers 215, 216, 217 and 218 between the highly electrically conductive electrode layers 220, 221, 222, and 223. However, other weakly electrically conductive materials can be used for the intermediate layers 215, 216, 217, and 218 as well including: silicon nitride; oxy-nitride; as well as any high-quality and weakly electrically conductive materials such as dielectrics and insulators.

The method of deposition for the SiO2 layer is plasma-enhanced chemical-vapor deposition (PECVD), although other methods of deposition can be used as well including, evaporation, sputtering, Atomic Layer Deposition (ALD) and spin-on deposition for either SiO2 layer deposition or other materials layer depositions.

The weakly electrically conductive layers 215, 216, 217, and 218 and highly electrically conductive layers 220, 221, 222, and 223 will have lithography and etch performed on them to form electrical connections between the appropriate highly electrically conductive electrode layers in the DPG device 101 to the microelectronics 201 fabricated on the substrate 200. This will be done at a location away from where the DPG device array 140 is located on the DPG device die 101. This lithography and etching on this highly electrically conductive layer can be done prior to deposition of each weakly electrically conductive intermediate 215, 216, 217, and 218 and highly electrically conductive layer 220, 221, 222, and 223 or later in the fabrication process sequence. Importantly, this lithography and etching does not require high resolution or exact alignment registration tolerances since it is performed at a location distance from where the DPG devices 102 are located in the DPG array 140 on the DPG device die 101

The etching of the highly electrically conductive layers in the DPG structure performed during the DPG device fabrication at locations away from the DPG array will depend on the type of highly electrically conductive material layer used and the resolution and fidelity required. Reactive ion etching (RIE) is the preferred method to etch the highly electrically conductive layers. In the case of some highly electrically conductive material layers, such as Platinum, the material layer may be patterned using lift-off wherein a photoresist is deposited prior to the deposition of the highly electrically conductive material layer and then the highly electrically conductive material layer is deposited, the photoresist is lifted off (along with the highly electrically conductive material layer deposited on top of the photoresist), thereby leaving the highly electrically conductive material layer only in the locations where it was directly deposited onto the underlying, non-photoresist layer. Also, for some highly electrically conductive material layers for which plasma etch technology for that highly electrically conductive material layer is not available, ion milling can also be used to pattern the highly electrically conductive material layer.

The etching of the weakly electrically conductive layers away from the DPG device array can be performed using plasma, reactive ion etching (RIE), lift-off, ion milling, etc. However, it is preferable to use RIE etching to etch the weakly electrically conductive layers. The type of plasma chemistry used will depend on the type of weakly electrically conductive material that is to be etched.

A separate metallization onto the contact pads 142 of the self-aligned DPG device die 101 may be performed to assist in wire-bonding or other appropriate packaging technique. Before packaging, the self-aligned DPG device 101 substrate is diced and cleaned. Subsequently, a charge dissipating coating 225 is deposited onto the self-aligned DPG device die (FIG. 6.n). This coating is conformal across the entire die surface 101, preferably providing a uniform coating on the sidewalls and bottom of the cylindrical trenches 103. At present, this charge dissipating coating is performed using Atomic Layer Deposition (ALD) and the coating has a sheet resistance as specified in Table 1.

In the present embodiment Platinum (Pt) is used for the base layer 210 or 212 and the top highly electrically conductive layer 223 is Nickel (Ni). Titanium (Ti) is being used for the interior (between the base and top metal layers) metal layers 220, 221, and 222. The Pt and Ti layers can be deposited by physical vapor deposition (PVD), either evaporation or sputtering. The Ni layer can also be deposited by evaporation or sputtering as well as electroplating.

The etching used to pattern each of these highly electrically conductive layers depends on the type of highly electrically conductive material layers used and the location of the etching. Specifically, the Ti layers in the self-aligned process are preferably etched during the final ICP etch to form the cylindrical trenches of the DPG using the same etch system as for the insulating layers.

The patterning of the Ti layers for implementing the electrical interconnects to the underlying CMOS or microelectronics 201 on the substrate 200 and away from the cylindrical trenches 103 can be performed using plasma etching, lift-off, or ion milling. The patterning of the bottom Pt electrode layer for implementing the electrical interconnects to the underlying CMOS or microelectronics 201 on the substrate 200 can be performed using plasma etching, lift-off, or ion milling. The patterning of the top Ni electrode layer for implementing the electrical interconnects to the underlying CMOS or microelectronics 201 on the substrate can be performed using plasma etching, lift-off, ion milling, or in the case of electroplating will be appropriately patterned once the resist mold is removed.

Each of these highly electrically conductive layers 210, 212, 220, 221, 222, and 223 may use a different highly electrically conductive material layer to make contact to the appropriate highly electrically conductive layers on the underlying CMOS or microelectronics 201 on the substrate 200.

Although we describe a DPG device employing a bottom Pt electrode layer, a multiplicity of intermediate electrode layers made of Ti, and a top electrode layer of Ni, other combinations or types of highly electrically conductive material layers can be used in the DPG device as desired. For example, the material choices for the deposited highly electrically conductive layers can include: platinum; Titanium-Tungsten; Aluminum; Titanium; Nickel; Copper, and others.

The type of photolithography used to pattern the top-most highly electrically conductive layer 223 can be either e-beam or deep ultra-violet (DUV) lithography. The patterning of the highly electrically conductive interconnect layers 220, 221, and 222 away from the cylindrical trenches can be e-beam, projection, or contact photolithography.

All process steps used for the fabrication of the self-aligned integrated DPG devices 101 are done at relatively low process temperatures, namely below 400 C, and therefore the fabrication process is compatible with microelectronics or CMOS integration. That is, the process sequence for the self-aligned advanced DPG device is done on microelectronic or CMOS wafers without degradation of the microelectronics or CMOS.

Although the DPG device 101 is typically fabricated onto a microelectronics 201 substrate 200, the DPG device 101 can also be fabricated onto a substrate 300 (FIG. 7) without electronics as well. In this case, the fabrication sequence is similar to that described for the integrated DPG device 101, except the starting substrate 300 has no electronics on it and will typically be composed of a blank semiconductor wafer, such as Silicon, although other materials and substrate types can be used as well including: other semiconductor substrates (e.g. Germanium, SiC, etc.), dielectrics (e.g., Al2O3, SiO2, etc.), ceramics, and metals. If a conductive substrate 300 material type is used, then an insulating material layer 301 will be deposited as a first step. This material layer 301 can be from any material that is electrically insulating including, SiO2, SiN, etc. and can be deposited onto the substrate 300 by any means including CVD, PVD, lamination, and thermal oxidation.

As with the integrated self-aligned DPG device 101 fabrication, the non-integrated DPG device is fabricated by a sequential deposition of alternating layers of weakly electrically conductive intermediate layers 303, 305, 307 and 309 and highly electrically conductive layers 304, 306, 308 and 310 on the substrate 300 (FIG. 7). And, as before, these layers 303, 305, 307, 309, 304, 306, 308 and 310 have no lithography and etching performed on them in the locations of the DPG device die 101 where the DPG pixels 102 are located in the DPG array 140.

A bottom electrode layer 302 is deposited onto the substrate 300 and patterned and etched into the shape of the bottom electrode 302 of the DPG device 101 design (FIG. 7.a). Then a sequential layer of alternating layers of weakly electrically conductive intermediate layers 303, 305, 307, and 309 and highly electrically conductive electrode layers 304, 306, 308 and 310 are deposited as continuous blanket layers onto the substrate 300 (FIGS. 7.b through 7.i).

Then the top most highly electrically conductive electrode layer 310 is patterned and etched to form circular openings 311 (FIG. 7.j). Subsequently, a reactive ion etch, preferably of a ICP etch type is performed (FIG. 7.k) to etch through the weakly electrically conductive intermediate layers 309, 307, 305 and 303 as well as the highly electrically conductive electrode layers 308, 306 and 304 to stop on the bottom electrode layer 302 thereby forming the cylindrical trench 103 of the DPG pixel 102 of the DPG device 101 array 140.

The ICP etch process used to form the cylindrical trenches preferably will be capable of a very high-aspect ratio etch through the stack of weakly electrically conductive intermediate layers 309, 307, 305 and 303 and highly electrically conductive material layers 308, 306 and 304.

Alternatively, the substrate is subsequently placed in a suitable RIE or ICP etch system to etch through the topmost weakly electrically conductive intermediate layer 309, then placed into a suitable RIE or ICP etch system to etch through the highly electrically conductive layer 308 below the topmost weakly electrically conductive intermediate layer, and then placed in a suitable RIE or ICP etch system to etch through the next weakly electrically conductive intermediate layer 307, and on and on, until the bottom electrode layer 302 has been reached.

It should be noted that an additional masking material layer (not shown in FIG. 7) may be deposited and patterned into the shape of the circular openings 311 on top of the highly electrically conductive layer 310 to act as a better protection during the RIE or ICP etch.

The material choices for the deposited highly electrically conductive layers 302, 304, 306, 308 and 310 can include: platinum; Titanium-Tungsten; Aluminum; Titanium; Nickel; Copper, and other metals. Alternatively, a conductive semiconductor (e.g., doped Silicon, Germanium, etc.) or electrically conductive ceramic material layers (e.g., Titanium-Nitride) can also be used for the highly electrically conductive electrode layers.

The highly electrically conductive layers can be deposited by physical vapor deposition (PVD), either evaporation or sputtering, as well as Chemical Vapor Deposition (CVD) as well as Atomic Layer Deposition (ALD). The top most highly electrically conductive layer can also be deposited using electroplating into a suitably defined polymer mold that can be subsequently removed in which case the top most highly electrically conductive layer is defined by the polymer mold and no etch of the top most highly electrically conductive layer is required.

A silicon dioxide (SiO2) is used as the weakly electrically conductive intermediate layers 303, 305, 307, and 309 between the highly electrically conductive electrode layers 304, 306, 308 and 310. However, other weakly electrically conductive materials can be used for the intermediate layers 303, 305, 307, and 309 as well including: silicon nitride; oxy-nitride; as well as any high-quality weakly electrically conductive materials such as dielectrics and insulators. The method of deposition for the SiO2 layer is plasma-enhanced chemical-vapor deposition (PECVD), although other methods of deposition can be used as well including, evaporation, sputtering, Atomic Layer Deposition (ALD) and spin-on deposition for either SiO2 layer deposition or other materials layer depositions.

The weakly electrically conductive layers 303, 305, 307, and 309 and highly electrically conductive layers 304, 306, 308, and 310 will have lithography and etching performed on them to form electrical connections between the appropriate highly electrically conductive electrode layers 302, 304, 306, 308 and 310 in the DPG device 101 to the electrical interconnects 141 that run to the bond pads 142 at the edge of the DPG device die 101 on the substrate 300. This will be done at a location away from where the DPG device array 140 is located on the DPG device die 101. This lithography and etching on this highly electrically conductive layer can be done prior to deposition of each weakly electrically conductive intermediate 303, 305, 307, and 309 and highly electrically conductive layer 302, 304, 306, 308 and 310 or later in the fabrication process sequence. Importantly, this lithography and etching does not require high resolution or exact alignment registration tolerances since it is performed at a location distance from where the DPG devices 102 are located in the DPG array 140 on the DPG device die 101

The etching of the highly electrically conductive layers in the DPG structure performed during the DPG device fabrication at locations away from the DPG array will depend on the type of material and the resolution and fidelity required. Reactive ion etching (RIE) is the preferred method to etch these layers. In the case of some materials, such as Platinum, the material may be patterned using lift-off wherein a photoresist is deposited prior to the deposition of the material and then the material layer is deposited, the photoresist is lifted off (along with the material layer deposited on top of the photoresist), thereby leaving material layer only in the locations where it was directly deposited onto the underlying, non-photoresist layer. Also, for some material layers for which a plasma etch technology for that material layer is not available, ion milling can also be used to pattern the layer.

The etching of the weakly electrically conductive layers away from the DPG device array can be performed using plasma, reactive ion etching (RIE), lift-off, ion milling, etc. However, it is preferable to use RIE etching to etch the weakly electrically conductive layers. The type of plasma chemistry used will depend on the type of weakly electrically conductive material that is to be etched.

A separate metallization onto the contact pads 142 of the self-aligned DPG device die 101 may be performed to assist in wire-bonding or other appropriate packaging technique. Before packaging, the self-aligned DPG device 101 substrate is diced and cleaned. Subsequently, a charge dissipating coating 225 is deposited onto the self-aligned DPG device die (FIG. 7.l). This coating is conformal across the entire die surface 101, preferably providing a uniform coating on the sidewalls and bottom of the cylindrical trenches 103. At present, this charge dissipating coating is performed using Atomic Layer Deposition (ALD) and the coating has a sheet resistance as specified in Table 1.

In the present embodiment Platinum (Pt) metal is used for the base layer 302 and the top metal layer 310 is Nickel (Ni). Titanium (Ti) is being used for the interior (between the base and top metal layers) metal layers 304, 306 and 308. The Pt and Ti layers can be deposited by physical vapor deposition (PVD), either evaporation or sputtering. The Ni layer can also be deposited by evaporation or sputtering as well as electroplating.

The etching used to pattern each of the highly electrically conductive layers depends on the type of highly electrically conductive layer used and the location of the etching. Specifically, the Ti layers in the self-aligned process are preferably etched during the final ICP etch to form the cylindrical trenches of the DPG using the same etch system as for the weakly electrically conductive material layers.

The patterning of the Ti layers for implementing the electrical connections to the underlying interconnects 141 on the substrate 300 and to the bond pads 142 away from the cylindrical trenches 103 DPG device array 140 can be performed using plasma etching, lift-off, or ion milling. The patterning of the bottom Pt electrode layer 302 for implementing the electrical interconnects 141 to the bond pads 142 on the substrate 300 can be performed using plasma etching, lift-off, or ion milling. The patterning of the top Ni electrode layer 310 for implementing the electrical interconnects to the bond pads 142 on the substrate 300 can be performed using plasma etching, lift-off, ion milling, or in the case of electroplating will be appropriately patterned once the resist mold is removed.

Each of these highly electrically conductive layers 302, 304, 306, 308 and 310 may use a different highly electrically conductive material layer for each layer in the stack, as well as a different highly electrically conductive material layer to make electrical interconnects between the electrodes 302, 304, 306, 308 and 310 in the DPG device 101 and the bond pads 142 on the substrate 300.

Although we describe a DPG device employing a bottom Pt electrode layer, a multiplicity of intermediate electrode layers made of Ti, and a top electrode layer of Ni, other combinations or types of highly electrically conductive materials can be used in the DPG device as desired. For example, the material choices for the deposited highly electrically conductive layers can include: platinum; Titanium-Tungsten; Aluminum; Titanium; Nickel; Copper, and others.

The type of photolithography used to pattern the top-most highly electrically conductive layer 310 can be either e-beam or deep ultra-violet (DUV) lithography. The patterning of the highly electrically conductive interconnect layers 302, 304, 306, and 308 away from the cylindrical trenches can be e-beam, projection, or contact photolithography.

Charge Dissipating Coating in Self Aligned DPG Device

As described above, upon complete fabrication of the DPG device 101 as per FIGS. 6 and 7, a very thin ALD coating 225 is required to cover primarily the interior surfaces of the columns in the device. The purpose of the coating is to prevent a build-up of electrical charge from the incoming electrons on the weakly electrically conductive surfaces in the columns 102, which would adversely affect the electrical field structure meant to control the electrons in the device.

However, an unreasonably short device lifetime can result from the low reliability of this charge dissipating coating layer 225 that is attributed to the inability of the ALD coating to properly discharge the incoming electrons in sustained fashion over extended periods of exposure to the electron beam. This failure might develop as a result of structural changes, electrical breakdown, and/or ablation in the ALD layer 225 due to high field strengths across the layer and localized heating associated with the electron bombardment and current dissipation within the layer 225. Moreover, a coating and material that can sustain operating conditions long enough to allow for useful utilization of the DPG device 101 in an actual patterning process may not be feasible.

Therefore, an alternate embodiment of the DPG device 101 that eliminates the ALD coating or any charge dissipating coating or layer 225 and yet still allows the charge to be dissipated, while meeting all the device 101 electrical and dimensional performance specifications has been invented and is described below.

Self-Aligned Advanced DPG Device

The self-aligned advanced DPG device 101 is designed to eliminate the need for the charge dissipating coating 225. The key aspect in the advanced DPG device 101 that will allow the charge dissipating layer 225 to be eliminated is the replacement of the intermediate weakly electrically conductive layers (215, 216, 217 and 218 in FIGS. 6 and 303, 305, 307 and 309 in FIG. 7) in the structure with a high resistivity material. Ideally, the material resistivity is such that the incoming electrons in the DPG device 101 columns 103 incur an electrical field structure identical to that of a functional ALD coating 225 on the regular DPG devices 101. In other words, the electrical conduction of the intermediate layer mirrors or emulates that of the ALD coating 225 in the current DPG devices 101.

There are numerous thin film materials that can be used as the intermediate layer in the advanced DPG device 101, and that are also compatible with the overall fabrication approach of the self-aligned DPG device 101. One set of candidate materials for this purpose are semiconductors (such as Silicon or Germanium), which in their pure crystalline form are very poor electrical conductors, but when deposited in thin films by evaporation or sputtering allow for electrical conduction along grain boundaries. By carefully adjusting deposition conditions, it is possible to control the grain size and oxidation level in the film, and thereby the effective film resistivity. A material like Silicon is readily integrated into the self-aligned or non-self-aligned DPG fabrication sequences.

Importantly, using silicon in the advanced DPG device 101 as the intermediate layers allows a higher aspect ratio ICP etch technology to be used for the cylindrical trench etch thereby simplifying the fabrication, improving device 101 performance, as well as lowering the manufacturing cost.

The self-aligned advanced integrated DPG fabrication is described in FIG. 6, except each of the intermediate layers 215, 216, 217 and 218 that were made of a weakly electrically conductive material are replaced in the process sequence with a deposited high resistivity material layer.

As before, as many alternating layers are deposited in the stack as desired to obtain the required performance and based on the intended application. Subsequently, the top layer highly electrically conductive 223 is patterned using photolithography to form circular openings 224 (FIG. 6.*l*) and a through-layer etch (FIG. 6.*m*) to open up the openings where the DPG pixels 102, namely the cylindrical trenches 103 will be located is performed. Next, an ICP high-aspect ratio etch is performed to form the cylindrical trenches and stopping on the bottom electrode layer (FIG. 6.*m*). Obviously, the deposition of a charge dissipating coating 225 is omitted in the fabrication of the advanced self-aligned DPG device 101.

The same candidate highly electrically conductive layers used and methods of deposition and etching can be used for the highly electrically conductive electrode layers in the advanced self-aligned DPG device as were described in the self-aligned DPG device 101.

In the present embodiment semiconductors, such as silicon or germanium, are used as the high resistivity material for the intermediate layers between the highly electrically conductive layers. However, other high resistivity materials can be used as well for these intermediate layers.

The intermediate layers can be deposited by means of ion-assisted evaporation, sputtering, as well as other methods of deposition.

The resistivity of the deposited intermediate layers can be varied during deposition by back-filling the process chamber with oxygen to properly tune the intermediate layer resistivity. Additionally, other deposition process parameters can also be varied to tune the resistivity including: deposition temperature; deposition rate; etc.

Based on the DPG requirements stated in Table 1, a target required bulk resistivity of the intermediate layer is $2*10^4$ ohm-cm. Using an intermediate layer with a resistivity of this amount results in an advanced DPG device 101 with similar electrical characteristics to that of a device 101 with weakly electrically conductive intermediate layers and an ALD conductive charge dissipating coating in the columns. Note that the power due to Joule heating between the electrode layers by replacing the intermediate layer with a material having this resistivity would be less than a few tens of milliWatts over the entire array and therefore would be insignificant.

If the intermediate layer materials are silicon or germanium, a suitable plasma etch chemistry for the column etch composed of a $SF_6$ chemistry or a chlorine-based chemistry can be employed to etch the DPG columns 103. To achieve high aspect ratios in the cylindrical trench etches, an Inductively-Coupled Plasma (ICP) etch system may be used such as the so-called "Bosch" Deep Reactive Ion Etch (DRIE) process.

All process steps used for the fabrication of the self-aligned advanced DPG devices 101 are done at relatively low process temperatures, namely below 400 C, and therefore the fabrication process is compatible with CMOS integration. That is, the process sequence for the self-aligned advanced DPG device is done on CMOS wafers without degradation of the CMOS.

Like the fabrication of the self-aligned DPG device 101 made with weakly electrically conductive intermediate layers, the processing steps and materials to make electrical interconnects from the DPG devices 102 to the bond pads 142 can be done in similar fashion.

An advanced non-integrated DPG device 101 can also be implemented and will follow the process sequence outlined in FIG. 7 except the weakly electrically conductive intermediate layers 303, 305, 307 and 309 are replaced with high resistivity material layers and as with the integrated advanced self-aligned DPG device, all the other processing and materials are similar except that a DRIE ICP etch can be used to implement the DPG columns 103 and the charge dissipating coating or layer 225 is not deposited onto the device 101.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A dynamic pattern generator device for modulating at least one electron beam used for electron-beam imaging or direct-write lithography, the device comprising:
   a substrate,
   a plurality of alternating high resistivity material and highly electrically conducting layers deposited on the substrate,
   a plurality of pixels forming an array of pixels for modulating electron beams, each pixel being a cylindrical-shaped trench formed in the plurality of alternating high resistivity material and highly electrically conducting layers deposited on the substrate and having an electrode in the form of a highly electrically conductive pad at the bottom of the trench,
   a plurality of inter-trench separating walls located between the plurality of pixels, and
   wherein the size of the active device area and the number of pixels forming the array of pixels in the active device area determines a number of electron beams that can be modulated by the dynamic pattern generator device and thereby a rate of electron-beam imaging or direct writing rate of the dynamic pattern generator device, and
   wherein the high resistivity material layers eliminate a need for a charge dissipating coating on interior surfaces of the pixels in the device to prevent a build-up of electrical charge from incoming electrons on insulating surfaces in the pixels,
   the highly electrically conducting layers being formed from materials selected from metals, conductive semiconductor materials and conductive ceramic materials,
   the high resistivity material being formed from non-metal materials, including semiconductor materials.

2. The dynamic pattern generator device of claim 1, wherein the array of pixels is contained in an active device area of the substrate.

3. The dynamic pattern generator device of claim 1, wherein the pixels are micron-scale pixels.

4. The dynamic pattern generator device of claim 1, wherein the bottom electrodes have conductive protection layer on top to prevent corrosion of the electrodes and for making electrical contact to the electrodes.

5. The dynamic pattern generator device of claim 1, wherein each of the plurality of highly electrically conducting layers is a metal.

6. The dynamic pattern generator device of claim 1, wherein each of the plurality of high resistivity layers is a semiconductor material, such as silicon or germanium.

7. The dynamic pattern generator device of claim 1, wherein a resolution level of the electron-beam imaging and direct-wire lithography provided by the dynamic pattern generator device is determined by the number of high resistivity and highly electrically conducting layers deposited on the substrate.

8. The dynamic pattern generator device of claim 1, wherein a fineness of the resolution of the electron-beam imaging and direct-write lithography provided by the dynamic pattern generator device is determined by the number of high resistivity and highly electrically conducting layers deposited on the substrate.

9. The dynamic pattern generator device of claim 1, wherein each of the highly electrically conductive layers is a metal approximately 100-nm thick.

10. The dynamic pattern generator device of claim 1, wherein each of the high resistivity layers has a thickness in the range of 0.5 to 1.0 microns.

11. The dynamic pattern generator device of claim 1, wherein the array of pixels comprises an array of 4375 by 625 pixels.

12. The dynamic pattern generator device of claim 1 further comprising a plurality of bond pads formed on the substrate, and a plurality of electrical interconnects connecting the pixel bottom electrodes and the plurality of highly electrically conducting layers to the plurality of bond pads.

13. The dynamic pattern generator device of claim 1 further comprising a plurality of microelectronic devices fabricated on the substrate for addressing the pixels forming the array of pixels.

14. The dynamic pattern generator device of claim 13, wherein the microelectronic devices are located underneath the active device area of the substrate.

15. The dynamic pattern generator device of claim 14, wherein the microelectronic devices have electrical connections between the bottom electrodes of individual pixels and electrical connections to each of the highly electrically conductive layers.

16. The dynamic pattern generator device of claim 13, wherein the microelectronic devices are CMOS electronic devices, wherein each pixel device in the array of pixels has an active array of 4096 by 248, and wherein any pixels not driven by the CMOS electronic devices are used as "buffer" pixels to mitigate edge effects.

17. The dynamic pattern generator device of claim 1, wherein the substrate is a blank substrate and where individual addressing of the pixels in the array of pixels is done using off-substrate electronics.

18. The dynamic pattern generator device of claim 5, wherein the metal layers are formed from Platinum, Titanium-Tungsten, Aluminum, Titanium, Nickel, or Copper.

19. The dynamic pattern generator device of claim 5, wherein the highly conductive layers are formed from a conductive semiconductor material, including Silicon and Germanium, or a ceramic material, including Titanium-Nitride.

* * * * *